US005917917A

United States Patent [19]

Jenkins et al.

[11] Patent Number: 5,917,917

[45] Date of Patent: Jun. 29, 1999

[54] REDUCED-MEMORY REVERBERATION SIMULATOR IN A SOUND SYNTHESIZER

[75] Inventors: Michael V. Jenkins; Qiujie Dong, both of Austin, Tex.; Edward M. Veeser, Ann Arbor, Mich.

[73] Assignee: Crystal Semiconductor Corporation, Austin, Tex.

[21] Appl. No.: 08/713,343

[22] Filed: Sep. 13, 1996

[51] Int. Cl.[6] .......... H03G 3/00

[52] U.S. Cl. .......... 381/63; 84/630

[58] Field of Search .......... 381/61, 63; 84/630, 84/707, DIG. 26

[56] References Cited

U.S. PATENT DOCUMENTS

| | | | |
|---|---|---|---|
| Re. 33,739 | 11/1991 | Takashima et al. . | |
| 4,214,501 | 7/1980 | von Kemenczky | 84/1.03 |
| 4,489,439 | 12/1984 | Scholz et al. | 381/63 |
| 4,509,191 | 4/1985 | Miller | 381/63 |
| 4,584,700 | 4/1986 | Scholz | 381/61 |
| 4,584,921 | 4/1986 | Wachi . | |
| 4,649,786 | 3/1987 | Niinomi et al. | 84/1.19 |
| 4,731,835 | 3/1988 | Futamase et al. . | |
| 4,748,669 | 5/1988 | Klayman | 381/1 |
| 4,841,572 | 6/1989 | Klayman | 381/17 |
| 4,866,774 | 9/1989 | Klayman | 381/1 |
| 4,909,119 | 3/1990 | Morokuma | 84/702 |
| 4,942,799 | 7/1990 | Suzuki . | |
| 4,955,057 | 9/1990 | Tominari | 381/63 |
| 5,012,199 | 4/1991 | McKale | 330/51 |
| 5,123,050 | 6/1992 | Serikawa et al. | 381/61 |
| 5,140,886 | 8/1992 | Masaki et al. . | |
| 5,179,238 | 1/1993 | Hotta | 84/478 |
| 5,201,005 | 4/1993 | Matsushita et al. | 381/63 |
| 5,300,723 | 4/1994 | Ito | 84/601 |
| 5,317,104 | 5/1994 | Frost | 84/625 |
| 5,333,203 | 7/1994 | Diaz | 381/62 |
| 5,342,990 | 8/1994 | Rossum . | |
| 5,384,856 | 1/1995 | Kyouno et al. | 381/63 |
| 5,451,707 | 9/1995 | Suzuki . | |
| 5,519,166 | 5/1996 | Furuhashi et al. . | |
| 5,521,329 | 5/1996 | Yamauchi et al. . | |
| 5,555,306 | 9/1996 | Gerzon | 381/63 |
| 5,567,901 | 10/1996 | Gibson et al. . | |
| 5,587,548 | 12/1996 | Smith, III . | |
| 5,621,801 | 4/1997 | Kunimoto et al. | 381/63 |
| 5,740,716 | 4/1998 | Stilson . | |

FOREIGN PATENT DOCUMENTS

| | | |
|---|---|---|
| 0178840 | 4/1986 | European Pat. Off. . |
| 0568789 | 11/1993 | European Pat. Off. . |
| WO9534883 | 12/1995 | WIPO . |

*Primary Examiner*—Vivian Chang
*Attorney, Agent, or Firm*—Ken J. Koestner; J. P. Violette

[57] ABSTRACT

A sound or music synthesizer includes a reverberation simulator having a substantially reduced volatile storage, random access memory, or buffer size in comparison to conventional reverberation simulators by decimating the sound signal prior to applying the sound signal to a reverberator and then interpolating the sound signal generated by the reverberator to restore the sample frequency. The substantial reduction in buffer size enables the usage of the reverberator in low-cost, reduced size and single-chip environments.

36 Claims, 15 Drawing Sheets

REDUCED-MEMORY REVERBERATION SIMULATOR IN A SOUND SYNTHESIZER

BACKGROUND OF THE INVENTION

1. Field of the Invention

The present invention relates to a wavetable synthesizer for usage in an electronic musical instrument. More specifically, the present invention relates to a digital reverberation simulator and operating method having a reduced memory size through usage of a decimation and interpolation filters.

2. Description of the Related Art

A synthesizer is an electronic musical instrument which produces sound by generating an electrical waveform and controlling, in real-time, various parameters of sound including frequency, timbre, amplitude and duration. A sound is generated by one or more oscillators which produce a waveform of a desired shape.

Acoustical characteristics of musical venues, including the finest concert halls and auditoriums, is highly dependent on reverberation characteristics. Synthesizers commonly use different forms of special effects to produce a pleasing sound. One highly pleasing special effect is reverberation simulation.

The first electronic reverberation simulators were designed using conventional analog circuitry. Analog reverberators were so difficult to design that designers commonly resorted to reverberation using mechanical devices such as springs and special metal plates.

Development of digital circuitry greatly eased the problems in producing reverberation simulators. Digital reverberators are highly flexible and produce nearly any imaginable form of reverberation. A simple digital reverberator includes a delay element and a mixer for mixing delayed and undelayed sound signals, thereby generating a single echo. Multiple echoes are simulated in a digital reverberator by feeding a portion of the delayed output signal back to the input of the delay element, creating a sequence of echoes. Reverberation parameters for an echo include the duration of the delay and the relative amplitudes of the delayed and undelayed sounds.

One parameter of the digital reverberator is a feedback factor F which is indicative of the strength of the signal fed back to the delay element. The feedback factor F has a value in the range from 0 to 1. The larger the feedback factor F, the longer the sequence of audible echoes. An advantage of digital reverberators over analog reverberators is that no signal fidelity is lost during multiple passes through the delay element so that a feedback factor F close to one as possible without a minor amplitude response peak exceeding unity feedback and causing oscillation.

However, even with a perfect delay line, a sequence of echoes at equal intervals does not produce a concert hall-type reverberation. The reverberation heard in a concert hall results from an inverse exponential decay of echo amplitude over time that is common in physical processes. The rate of decrease in echo signal amplitude is commonly expressed as the time for a 60-dB reduction in echo amplitude where the 60-dB level approximates the level at which the reverberation signal becomes inaudible. Typical concert hall reverberation times range from approximately 1.5 to 3.0 seconds.

A reverberation process is also characterized by an echo density parameter. A reverberator formed from a single delay line suffers from a low and constant echo density of about 0.03 echoes/msec. In contrast, a concert hall reverberation has an echo density which rapidly builds to that no echoes are distinguished. One measure of the quality of simulated reverberation is the interval between an initial signal and the time the echo density reaches 1 echo per msec. A good quality reverberator reaches this echo density in about 100 msec. To avoid the perception of a distant sound, a delay of 10 msec to 20 msec should be interposed between the initial signal and the first echo.

A reverberation process naturally has an uneven amplitude response which rises and falls with a periodicity equal to the reciprocal of the delay time. The uneven amplitude response of a concert hall-quality reverberation has peaks and valleys that are closely spaced, irregular, and moderate in height and depth. Commonly, concert hall reverberation has several peaks and valleys per hertz unit of bandwidth with a typical excursion between a peak and valley of approximately 12 dB. When a resonance chamber is small, sounds are produced with a high echo density and a low resonance density since resonant modes spanning a large number of wavelengths of moderate frequency sound are precluded by the limited distances between reflective surfaces. The converse condition of high resonance density and low echo density is produced by a lengthy delay time in a feedback delay reverberator, creating a sound alien to a typical reverberation sound.

A concert hall quality reverberation may be reproduced exactly by recording an impulse response of a selected concert hall and applying a transversal filter technique to a sound to be reverberated. Typical reverberations times of 2 seconds require usage of a filter that is 50K to 100K samples long, a size that is clearly impractical for implementation in an integrated circuit. However, many circuits created from delay elements, summers and multipliers produce a reverberation echo so long as the circuit is stable and does not oscillate.

A practical integrated circuit implementation of a concert hall quality reverberation simulator commonly includes several delay elements having unequal delay lengths. The values of the plurality of delay lengths, for example the placement of taps in a single delay line, determines the quality of sound of the simulator. A highly pleasing sound is produced by placing the taps according to an approximately exponential distribution but also a distribution in which the taps are placed at prime number locations. This structure of a reverberation delay line creates a maximum rate of echo amplitude growth.

High-quality audio reproduction using synthesis such as wavetable audio synthesis is only achieved in a system which includes a large amount of memory, typically more than one megabyte, and which commonly includes more than one integrated circuit chip. Such a high-quality wavetable synthesis system is cost-prohibitive in the fields of consumer electronics, consumer multimedia computer systems, game boxes, low-cost musical instruments and MIDI sound modules.

Implementation of reverberation simulation to greatly improve the quality of sound produced by a synthesizer substantially increases the size of volatile or buffer storage. For example, a synthesizer which generates a 16-bit digital audio stream at 44.1 kHz typically employs a delay buffer size of about 32 Kbytes, an amount far higher than is feasible for implementation in low-cost and single-chip environments.

What is needed is a reverberation simulator having a substantially reduced memory size and computational load, and a reduced cost while attaining an excellent audio fidelity.

SUMMARY OF THE INVENTION

In accordance with the present invention, a sound or music synthesizer includes a reverberation simulator having a substantially reduced volatile storage, random access memory, or buffer size in comparison to conventional reverberation simulators by decimating the sound signal prior to applying the sound signal to a reverberator and then interpolating the sound signal generated by the reverberator to restore the sample frequency. The substantial reduction in buffer size enables the usage of the reverberator in low-cost, reduced size and single-chip environments.

In accordance with one embodiment of the present invention, a method of generating a reverberation effect in a sound signal of a sound signal path includes the steps of decimating the sound signal in the sound signal path to form a reduced sample rate sound signal and inserting a delay into the sound signal path to form a reduced sample rate sound signal and a relatively delayed reduced sample rate sound signal. The method further includes the step of accumulating the relatively delayed sound signal and the sound signal to form a multiple-echo sound signal having a reduced sample rate. Subsequently, the multiple-echo sound signal is interpolated to restore the sample rate to the sample rate prior to the decimating step.

In accordance with another embodiment of the invention, a sound synthesizer includes a sound signal path for carrying a sound signal and a decimator connected to the sound signal path for reducing the effective sample rate of the sound signal by a decimation factor. The sound synthesizer further includes a delay line of storage elements connected to the decimator in the sound signal path for generating a sound signal and a relatively delayed sound signal. The delay line has a number of storage elements reduced according to the decimation factor. The sound synthesizer has an accumulator connected to the delay line in the sound signal path for accumulating the relatively delayed sound signal and the sound signal, thereby forming a multiple-echo sound signal having the reduced effective sample rate. The sound synthesizer also includes an interpolator connected to the accumulator for interpolating the multiple-echo sound signal, thereby restoring the sample rate to the sample rate of the sound signal prior to the decimator.

Many advantages are gained by the described reverberation simulator and operating method. A fundamental advantage is that volatile storage, temporary storage, buffers or random access memory are substantially reduced in size while an excellent audio fidelity is attained. Advantageously, the substantially reduced temporary storage capacity allows implementation of a reverberation simulation fiction in low-cost or single integrated-circuit chip applications and environments. The reduced ROM and RAM memory sizes and data path width advantageously result in smaller components throughout the circuit and a smaller overall circuit size. In some embodiments, the lower sampling rates are exploited to advantageously conserve power improve signal fidelity.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings. The use of the same reference symbols in different drawings indicates similar or identical items.

DESCRIPTION OF THE PREFERRED EMBODIMENT(S)

Figure 1:
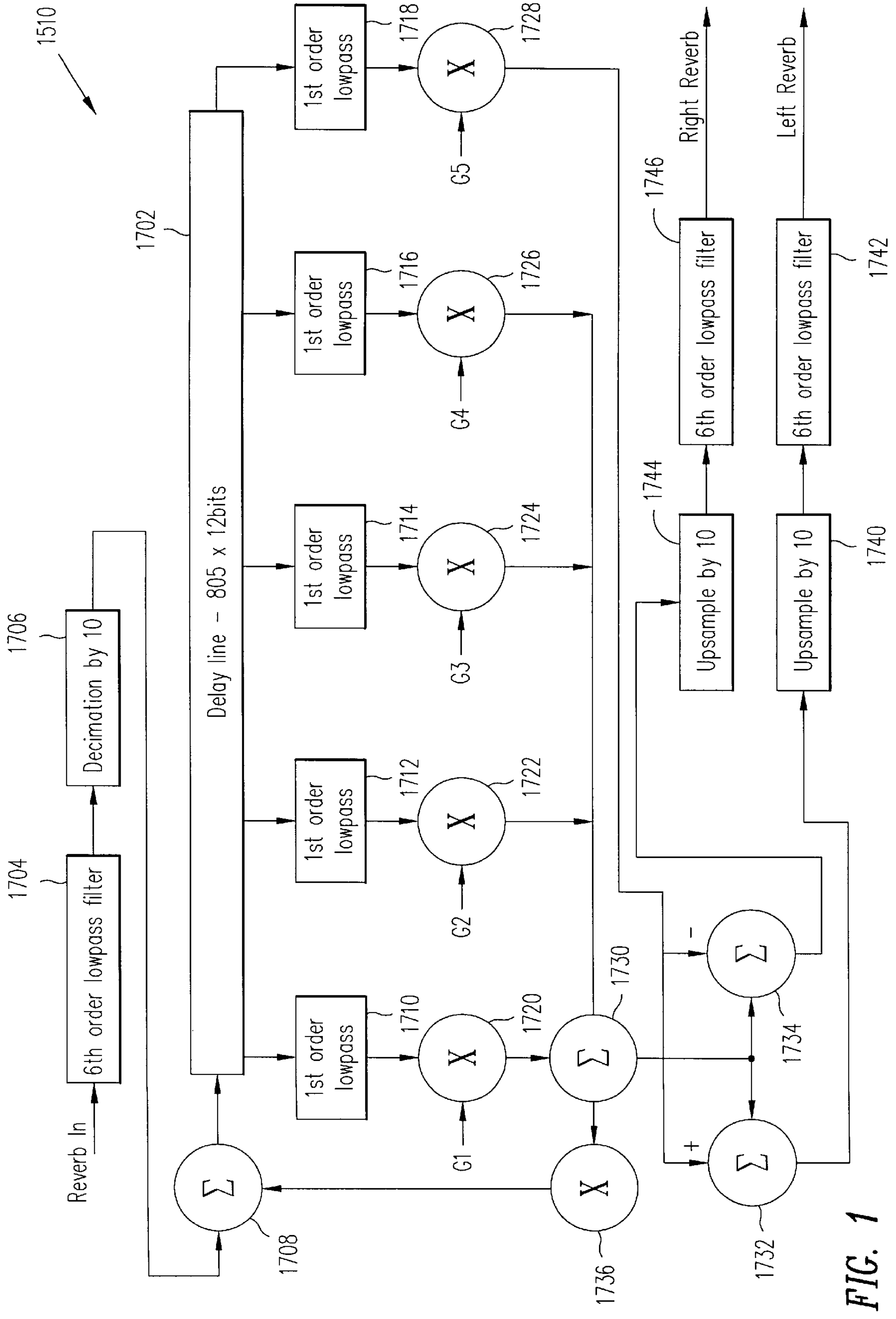
FIG. 1 is a schematic block diagram illustrating components of a reverberation (reverb) processing circuit in accordance with the present invention.
Figure 16:
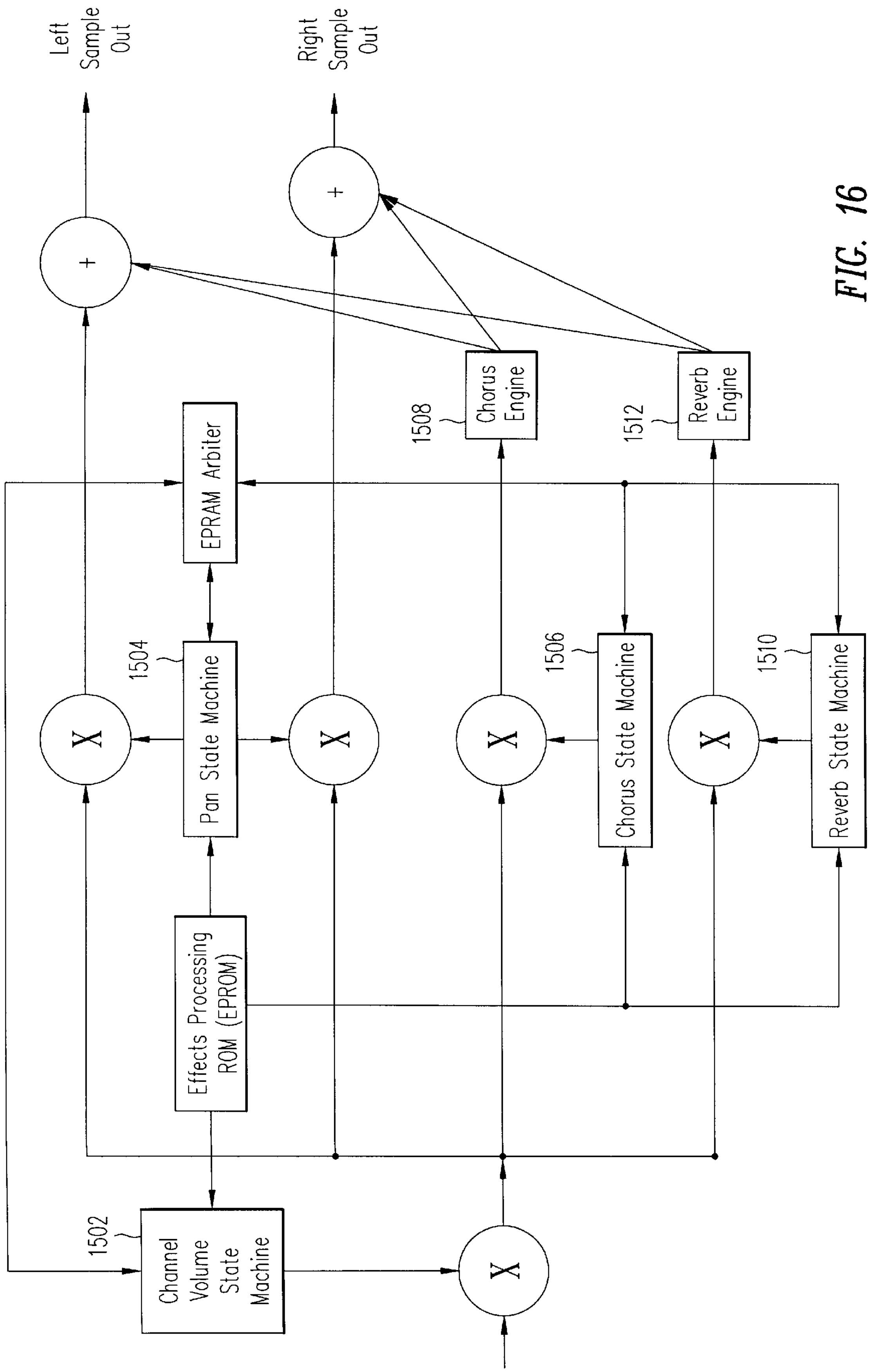
FIG. 16 is a schematic block diagram showing a channel effects state machine.

Referring to FIG. 1 in combination with FIG. 16, a schematic block diagram illustrates components of a reverb state machine 1510. The reverb state machine 1510 uses a reverb depth MIDI control parameter to determine the percentage of a channel sample to send to a reverb processor. The reverb calculation involves low pass filtering of a signal and summing of a plurality of the filtered signal with a plurality of incrementally-delayed, filtered and modulated copies of the filtered signal. The output of the reverb state machine 1510 is sent to output accumulators (not shown) for summing with the output signals from other state machines in the effects processor 108 shown in FIGS. 2A and 2B.

The reverb state machine 1510 is a digital reverberator which generates a reverberation effect by inserting a plurality of delays into a signal path and accumulating delayed and undelayed signals to form a multiple-echo sound signal. The plurality of delays is supplied by a delay line memory 1702 having a plurality of taps. In an illustrative embodiment, the delay line memory 1702 is implemented as a first-in-first-out (FIFO) buffer which is 805 words in length with a word-length of 14-bits. However, many suitable buffer lengths and word lengths are suitable for the delay line memory 1702. In one embodiment, the delay line memory 1702 includes taps at 77, 388, 644 and 779 words for a monaural reverberation determination. In other embodiments, the taps are placed at other suitable word positions. In some embodiments, the delay tap placement is programmed. Delay signals for the taps at 77, 388, 644 and 779 words, and a delay signal at the end of the delay line memory 1702 are respectively applied to first-order low-pass filters 1710, 1712, 1714, 1716 and 1718. Filtered and delayed signals from the first-order low-pass filters 1710, 1712, 1714, 1716 and 1718 are respectively multiplied by respective gain factors G1, G2, G3, G4 and G5 at multipliers 1720, 1722, 1724, 1726 and 1728. In the illustrative embodiment, the gain factors G1, G2, G3, G4 and G5 are programmable.

Delayed, filtered and multiplied signals from the multipliers 1720, 1722, 1724, and 1726 are accumulated at an adder 1730 to form a monaural reverberation result. The filtered and delayed signal at the end of the delay line memory 1702 at the output terminal of the multiplier 1728 is added to the monaural reverberation result at the output terminal of the adder 1730 using an adder 1732 to generate a left channel reverberation signal. The filtered and delayed signal at the end of the delay line memory 1702 at the output terminal of the multiplier 1728 is subtracted from the monaural reverberation result at the output terminal of the adder 1730 using an adder 1734 to generate a right channel reverberation signal.

The monaural reverberation result generated by the adder 1730 is applied to a multiplier 1736 which multiplies the monaural reverberation result by a feedback factor F. The feedback factor F is ¼ in the illustrative embodiment, although other feedback factor values are suitable. The result generated by the multiplier 1736 is added to a signal corresponding to the input signal to the reverb state machine 1510 at an adder 1708 and input to the delay line memory 1702 to complete the feedback path within the reverb state machine 1510.

To reduce memory requirements, the reverb state machine 1510 is operated at 4410 Hz. The input sound signals applied to the delay line memory 1702 via the adder 1708 are decimated to 4410 Hz from 44.1 KHz and interpolated back to 44.1 KHz upon exiting the reverb state machine 1510. The sound signal in the effects processor 108 is supplied at 44.1 KHz, filtered using a sixth order low pass filter 1704 and decimated by a factor of ten using a decimator 1706. The sixth order low pass filter 1704 filters the sound signal to 2000 Hz using three second order IIR low pass filters. In the illustrative embodiment, the decimator 1710 is a first order IIR filter which is implemented as a simple one-pole filter using shift and add operations, but no multiplication operations to conserve circuit area and operating time. The sound signal after reverberation is restored to 44.1 KHz by passing the left channel reverberation signal through a times ten interpolator 1740 and a sixth order low pass filter 1742 to generate a 44.1 KHz left channel reverberation signal. In the illustrative embodiment, the times ten interpolator 1740 is identical to the decimator 1706. The right channel reverberation signal is passed through a times ten interpolator 1744 and a sixth order low pass filter 1746 to generate a 44.1 KHz right channel reverberation signal.

Although a particular circuit embodiment is illustrated for the reverb state machine 1510, other suitable embodiments of a reverberation simulator are possible. In particular, a suitable reverb state machine may include a delay line memory having more or fewer storage elements and the individual storage elements may have a larger or smaller bit-width. Various other filters may be implemented, for example replacing the low pass filters with all pass filters. More or fewer taps may be applied to the delay line memory. Furthermore, the gain factors G may be either fixed or programmable and may have various suitable bit-widths.

Decimation of the sound signal prior to the application of reverberation is highly advantageous for substantially reducing memory requirements of the reverb state machine 1510. For example, in the illustrative embodiment the delay line memory 1702 includes 805 12-bit storage elements so that the total memory storage is approximately 1200 bytes. Without decimation and interpolation, about 12,000 bytes of relatively low-density random access memory would be used to implement the reverberation simulation functionality, a memory amount far higher than is possible in a low-cost, high fictionality or single-chip, high fictionality synthesizer application.

Although the decimation factor and the interpolation factor of the illustrative reverb state machine 1510 have a value of ten, in various embodiments the reverb state machine may be decimated and interpolated by other suitable factors.

Figure 2A:
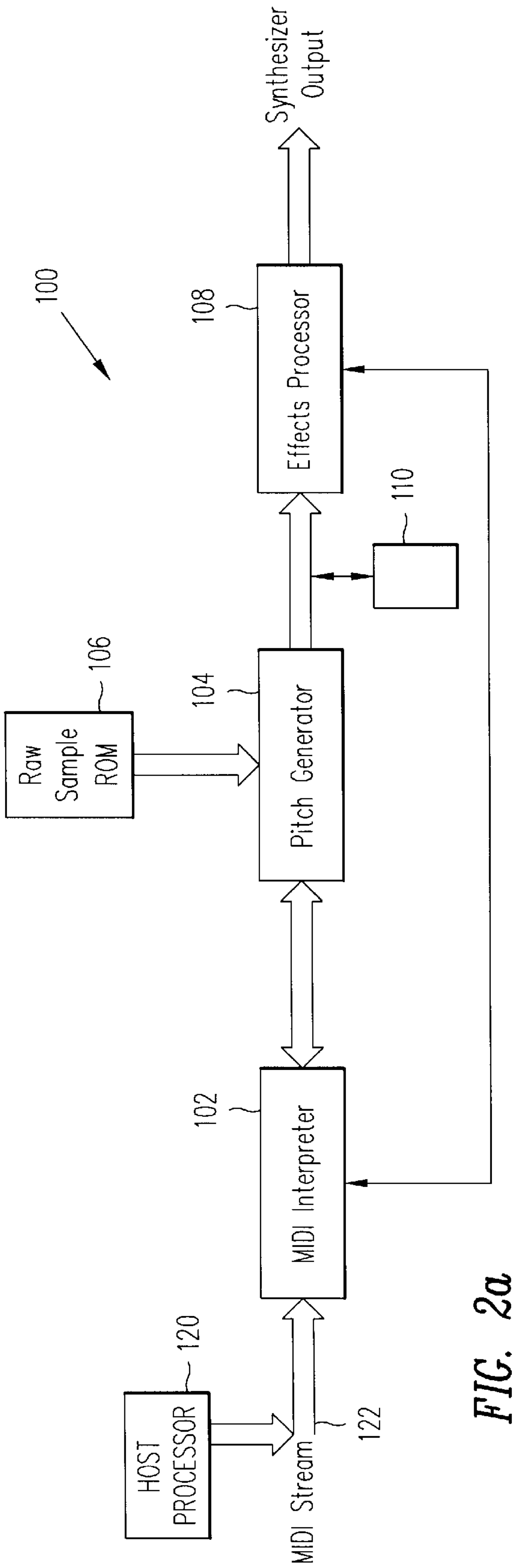
FIGS. 2A and 2B are schematic block diagrams illustrating two high-level block diagrams of embodiments of a Wavetable Synthesizer device in accordance with an embodiment of the present invention.
Figure 2B:
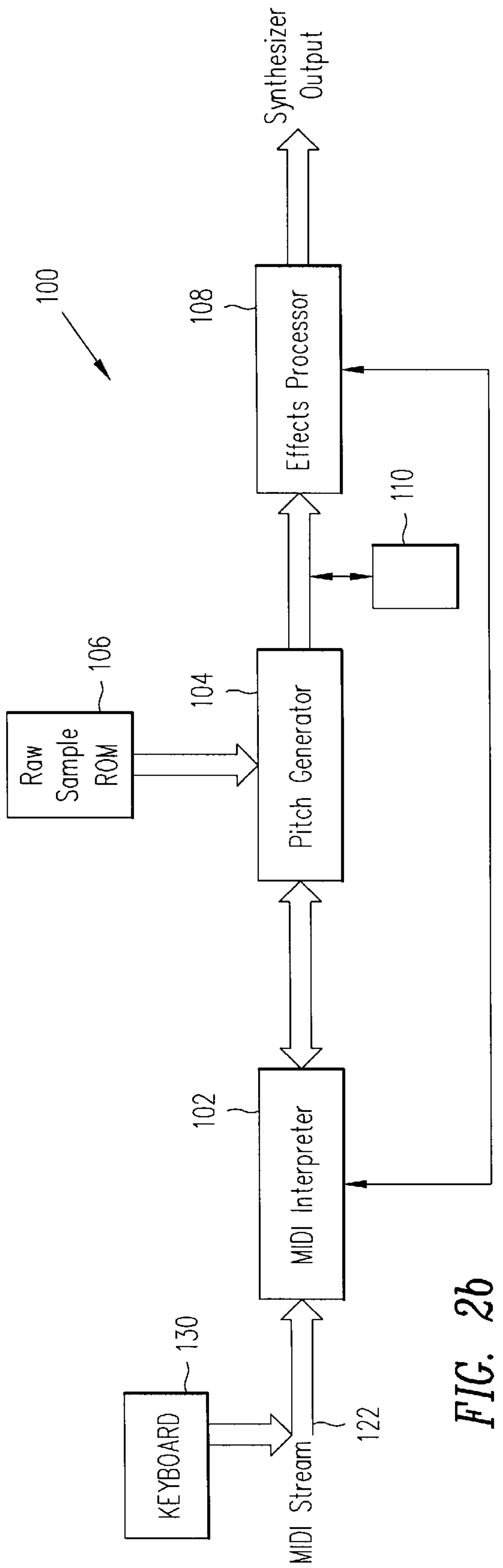

Referring to FIGS. 2A and 2B, a pair of schematic block diagrams illustrate a high-level block diagram of two embodiments of a Wavetable Synthesizer device 100 which access stored wavetable data from a memory and generate musical signals in a plurality of voices for performance. The Wavetable Synthesizer device 100 has a memory size which is substantially reduced in comparison to convention wavetable synthesizers. In an illustrative embodiment, the ROM memory size is reduced to an amount less than 0.5 Mbyte, for example approximately 300 Kbyte, and the RAM memory size is reduced to approximately 1 Kbyte, while producing a high-quality audio signal using a plurality of memory conservation techniques disclosed herein. In the illustrative embodiment, the Wavetable Synthesizer device 100 supports 32 voices. The notes for most instruments, each of which corresponds to a voice of the Wavetable Synthesizer device 100, are separated into two components, a high frequency sample and a low frequency sample. Accordingly, the two frequency components for each of the 32 voices are implemented as 64 independent operators. An operator is a single waveform data stream and corresponds to one frequency component of one voice. In some cases, more than two frequency band samples are used to recreate a note so that fewer than 32 separate voices may occasionally be processed. In some cases, more than two frequency band samples are used to recreate a note. In other cases, a single frequency band signal is sufficient to recreate a note.

Occasionally, all of the operators play notes which employ two or more operators so that a full 32 voices may not be supported. To accommodate this condition, the smallest contributor to the sound is determined and the note with the smallest contribution is terminated if a new "Note On" message is requested.

The usage of a plurality of independent operators also facilitates the implementation of layering and cross-fade techniques in a wavetable synthesizer. Many sounds and sound effects are a combination of multiple simple sounds. Layering is a technique using combination of several waveforms at one time. Memory is saved when a sound component is used in multiple sounds. Cross-fading is a technique which is similar to layering. Many sounds that change over time are recreated by using two or more component sounds having amplitudes which change over time. Cross-fading occurs as some sounds begin as a particular sound component but vary over time to a different component.

The Wavetable Synthesizer device 100 includes a Musical Instrument Digital Interface (MIDI) interpreter 102, a pitch generator 104, a sample read-only memory (ROM) 106, and an effects processor 108. In general the MIDI interpreter 102 receives an incoming MIDI serial data stream, parses the data stream, extracts pertinent information from the sample ROM 106, and transfers the pertinent information to the pitch generator 104 and the effects processor 108.

In one embodiment, shown in FIG. 2A, the MIDI serial data stream is received from a host processor 120 via a system bus 122. A typical host processor 120 is an x86 processor such as a Pentium™ or Pentium Pro™ processor. A typical system bus 122 is a ISA Bus, for example.

In a second embodiment, shown in FIG. 2B, the MIDI serial data stream is received from a keyboard 130 in a device such as a game or toy.

The sample ROM 106 stores wavetable sound information samples in the form of voice notes that are coded as a pulse code modulation (PCM) waveform and divided into two disjoint frequency bands including a low band and a high band. By dividing a note into two frequency bands, the number of operators processed is doubled. However, the disadvantage of additional operators more than compensated by a substantial reduction in memory size which is achieved using a suitably selected frequency division between the low and high bands.

For sustaining sounds, the substantial memory reductions are attained because the high frequency spectral content is nearly constant for a correctly chosen frequency division boundary so that the high frequency band is reconstructed from a one period sample of the high frequency band signal. With the high frequency component removed, the low frequency band is sampled at a lower rate and less memory is used to store a long spectral evolution of the low band signal.

For percussive sounds, the substantial memory reductions are attained even though a high frequency band is sampled at a high rate since the high frequency component quickly decays or becomes static. The high frequency component is removed and a low frequency band is sampled at a lower rate for a much longer sampling duration than the high frequency sampling time to recreate subtle spectral changes that are not easily restored by filtering a static waveform and adding a filtered static signal component to the waveform.

The pulse code modulation (PCM) waveforms stored in the sample ROM 106 are sampled at substantially the lowest possible sample rate as determined by the spectral content of the signal, whether the sample represents a high frequency band component or a low frequency band component. In some embodiments, sampling at the lowest possible sample rate substantially reduces the storage size of RAM, various buffers and FIFOs for holding samples, and data path width, thereby reducing circuit size. The samples are subsequently interpolated prior to processing to restore high and low frequency band components to a consistent sample rate.

The MIDI interpreter 102 receives a MIDI serial data stream at a defined rate of 31.25 KBaud, converts the serial data to a parallel format, and parses the MIDI parallel data into MIDI commands and data. The MIDI interpreter 102 separates MIDI commands from data, interprets the MIDI commands, formats the data into control information for usage by the pitch generator 104 and the effects processor 108, and communicates data and control information between the MIDI interpreter 102 and various RAM and ROM structures of the pitch generator 104 and effects processor 108. The MIDI interpreter 102 generates control information including MIDI note number, sample number, pitch tuning, pitch bend, and vibrato depth for application to the pitch generator 104. The MIDI interpreter 102 also generates control information including channel volume, pan left and pan right, reverb depth, and chorus depth for application to the effects processor 108. The MIDI interpreter 102 coordinates initialization of control information for the sound synthesis process.

Generally, the pitch generator 104 extracts samples from the sample ROM 106 at a rate equivalent to the originally recorded sample rate. Vibrato effects are incorporated by the pitch generator 104 since the pitch generator 104 varies the sample rate. The pitch generator 104 also interpolates the samples for usage by the effects processor 108.

More specifically, the pitch generator 104 reads raw samples from the sample ROM 106 at a rate determined by the requested MIDI note number, taking into account pitch tuning, vibrato depth and pitch bend effects. The pitch generator 104 converts the sample rate by interpolating the original sample rates into a constant 44.1 KHz rate to synchronize the samples for usage by the effects processor 108. The interpolated samples are stored in a buffer 110 between the pitch generator 104 and the effects processor 108.

Generally, the effects processor 108 adds effects such as time-varying filtering, envelope generation, volume, MIDI-specific pan, chorus and reverb to the data stream and generates operator and channel-specific controls of the data while operating at a constant rate.

The effects processor 108 receives the interpolated samples and adds effects such as volume, pan, chorus, and reverb while enhancing the sound production quality by envelope generation and filtering operations.

Figure 3:
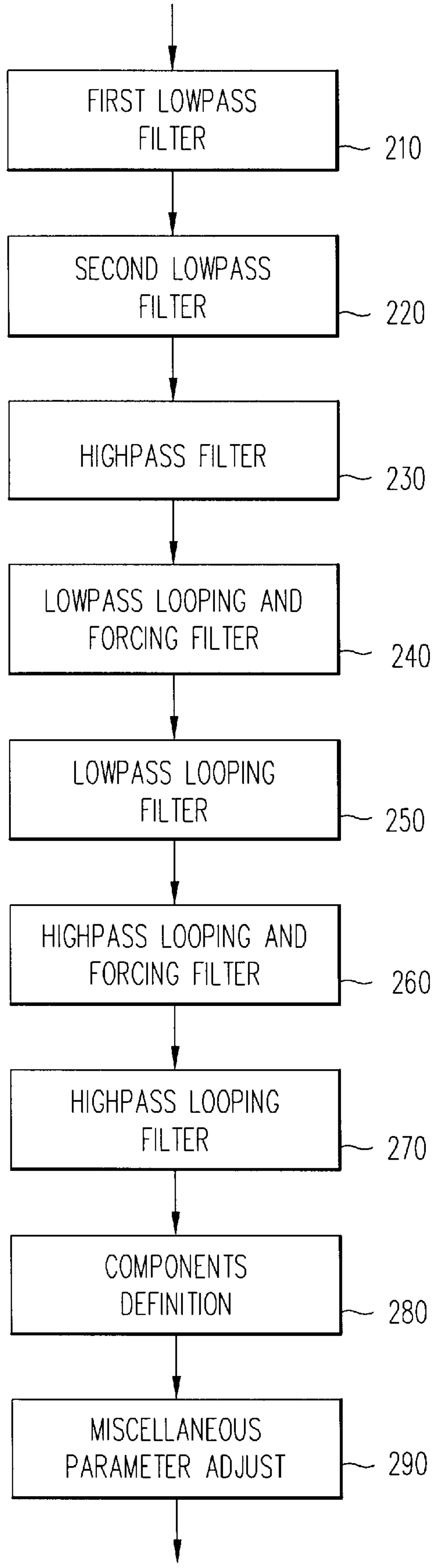
FIG. 3 is a flow chart which illustrates an embodiment of a method for coding sub-band voice samples.

Referring to FIG. 3, a flow chart illustrates an embodiment of a method, performed as directed by a sample editor, for coding sub-band voice samples for sounds including sustaining sounds, percussive sounds and other sounds. The method includes multiple steps including a first low pass filter 210 step, a second low pass filter 220 step, a high pass filter 230 step, an optional low pass looping forcing filter step 240, a low pass looping 250 step, an optional high pass looping forcing filter step 260, a high pass looping 270 step, a components decimation 280 step, and a miscellaneous reconstruction parameters adjusting 290 step.

The first low pass filter 210 step is used to set an upper limit to the sampling rate for the high frequency band, thereby establishing the maximum overall fidelity of sound signal reproduction. The Wavetable Synthesizer device 100 maintains a 50 dB signal to noise performance from the largest spectral component by supporting 8-bit PCM data. The sampling rate upper limit for the high frequency band determines the frequency characteristics of the first low pass filter.

Figure 4:
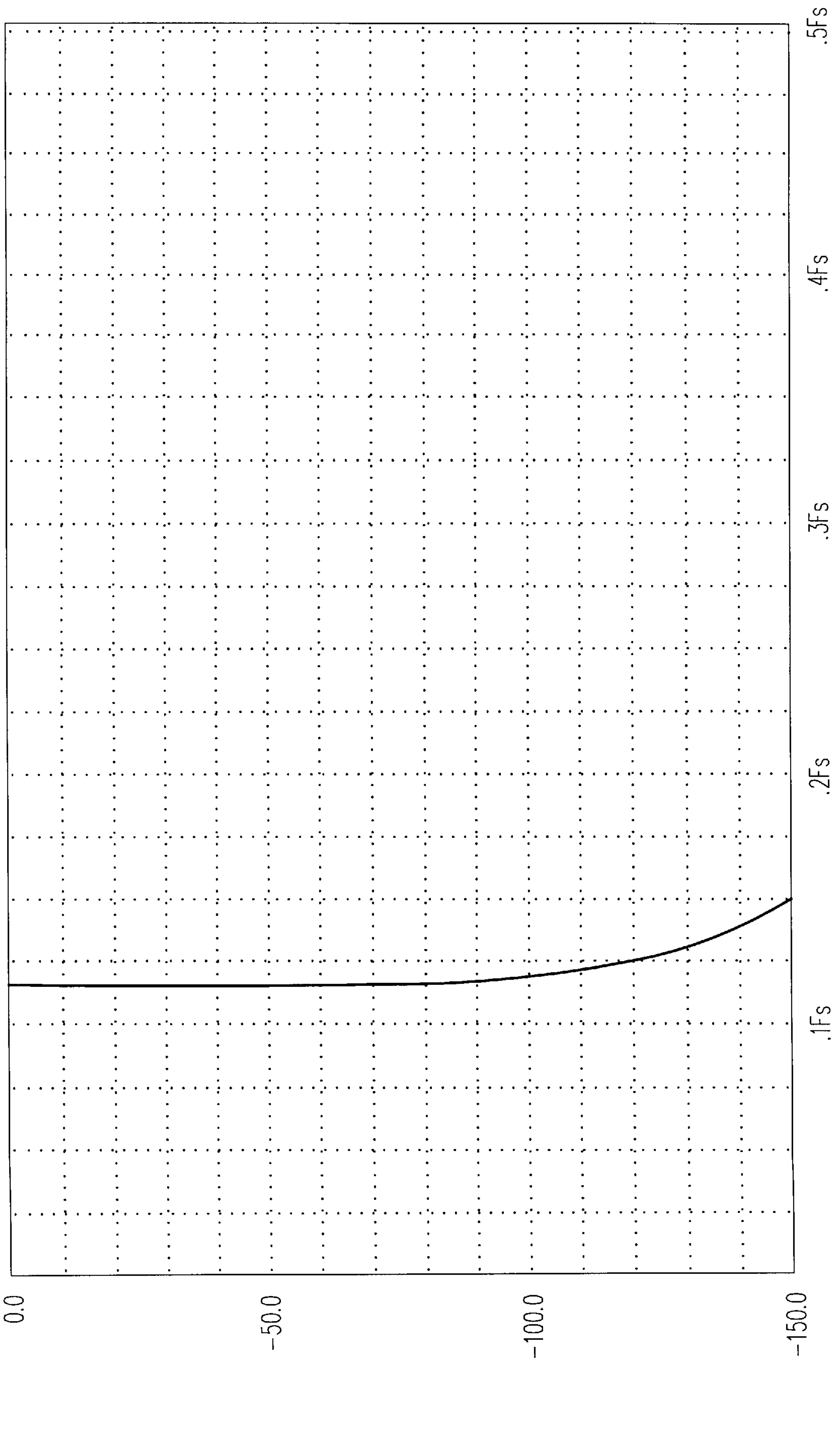
FIG. 4 is a graph showing the frequency response of a suitable sample creation low pass filter used in the method illustrated in FIG. 3.

FIG. 4 is a graph showing the frequency response of a suitable sample creation low pass filter (not shown). In an illustrative embodiment, the filters used in sample generation are 2048 tap finite impulse response (FIR) filters which are created by applying a raised cosine window to a sinc function. The cutoff frequency specified by the sample editor, 5000 Hz in the illustrative example, generates a set of coefficients which are accessed by a filtering program. In this example, coefficients inside the cosine window are 0.42, −0.5, and +0.08.

The second low pass filter 220 step produces the low frequency band signal which is coded as the primary component of a sound. The cutoff frequency for the second low pass filter 220 step is selected somewhat arbitrarily. Lower selected values of the cutoff frequency advantageously create a low frequency band signal having fewer samples but disadvantageously increases the difficulty coding the high frequency band signal. Higher selected values of the cutoff frequency advantageously reduce the difficulty of coding the high frequency band signal but disadvantageously save less memory. A suitable technique involves initially selecting a cutoff frequency which positions components attenuated by more than 35 dB into the high frequency band signal. The output of the second low pass filter is passed through a variable gain stage in an envelope flattening substep 222 to create a signal with a constant amplitude.

The envelope flattening substep 222 involves compression and application of an artificial envelope to a sampled waveform. Sounds that decay in time can usually be looped if the original sound is artificially flattened or smoothed in amplitude. Application of an envelope allows a decaying sound to be approximated by a nondecaying sound that has been looped if the original decay is recreated on playback.

The output signal of the second low pass filter 220 step contains much of the dynamic range at the same amplitudes as the original signal. For a sample encoded in 8-bit PCM format, quantization noise becomes objectionable as the signal strength decreases. To maintain a high signal strength relative to the quantization noise, the envelope flattening substep 222 flattens the decaying signal assuming that the decay of the signal is produced by a natural process and approximates an exponential decay.

The envelope flattening substep 222 first approximates the envelope of the decaying signal 224. Twenty millisecond windows are examined and each window is assigned an envelope value that represents the maximum signal excursion in that window. The envelope flattening substep 222 next searches for the best approximation to a true exponential decay 226 using values for the exponent ranging from 0.02 to 1.0, for example, relative to the signal at the beginning of a window. The best exponential fit is recorded for reconstruction. The envelope flattening substep 222 then processes the sound sample with an inverse envelope 228 to construct an approximately flat signal. The approximately flat signal is reconstructed with the recorded envelope to approximate the original waveform.

The high pass filter 230 step is complementary to the second low pass filter 220 step and uses the same cutoff frequency. The high pass portion of the signal is amplified to maintain a maximum signal strength.

Looping is a wavetable processing strategy in which only early portions of a pitched sound waveform are stored, eliminating storage of the entire waveform. Most pitched sounds are temporally redundant wherein the time domain waveform of the pitched sound repeats or approximately repeats after some time interval. The sub-band coding method includes several looping steps including the low pass looping forcing filter step 240, the low pass looping 250 step, the optional high pass looping forcing filter step 260, and the high pass looping 270 step.

The optional low pass looping forcing filter step 240 is most suitably used to encode sounds that never become periodic by subtly altering the sound, forcing the sound signal to become periodic. Most percussive sounds never become periodic. Other sounds become periodic but only over a very long time interval. The low pass looping forcing filter step 240 is applied to the sample waveforms resulting from the first low pass filter 210 step, the second low pass filter 220 step, and the high pass filter step 230. The low pass looping forcing filter step 240 is used to generate a suitable nearly-periodic waveform, a waveform which is recreated in a loop and performed without introducing audible, objectionable artifacts.

Nonperiodic waveforms usually have a nonperiodic form due to nonharmonic high frequency spectral content. High frequency components decay more rapidly than low frequency components so that looping of a waveform is gradually facilitated by looping for a significant period of time. The looping time varies for different instruments and sounds. Looping procedures and behavior for various waveforms is well known in the art of wavetable synthesis. The low pass looping forcing filter step 240 uses a comb filter having a selectivity that varies over time to accelerate the removal of nonharmonic spectral components from the nonperiodic waveform. In one embodiment, the loop forcing process is manual in which operation of the comb filter is audible if the selectivity increases too quickly. Typically, the low pass looping forcing filter functions best if the period of the filter is selected to be an integer multiple of the fundamental frequency of the desired note. Coefficients are sought which facilitate looping of the waveform without introducing objectionable artifacts.

Figure 5:
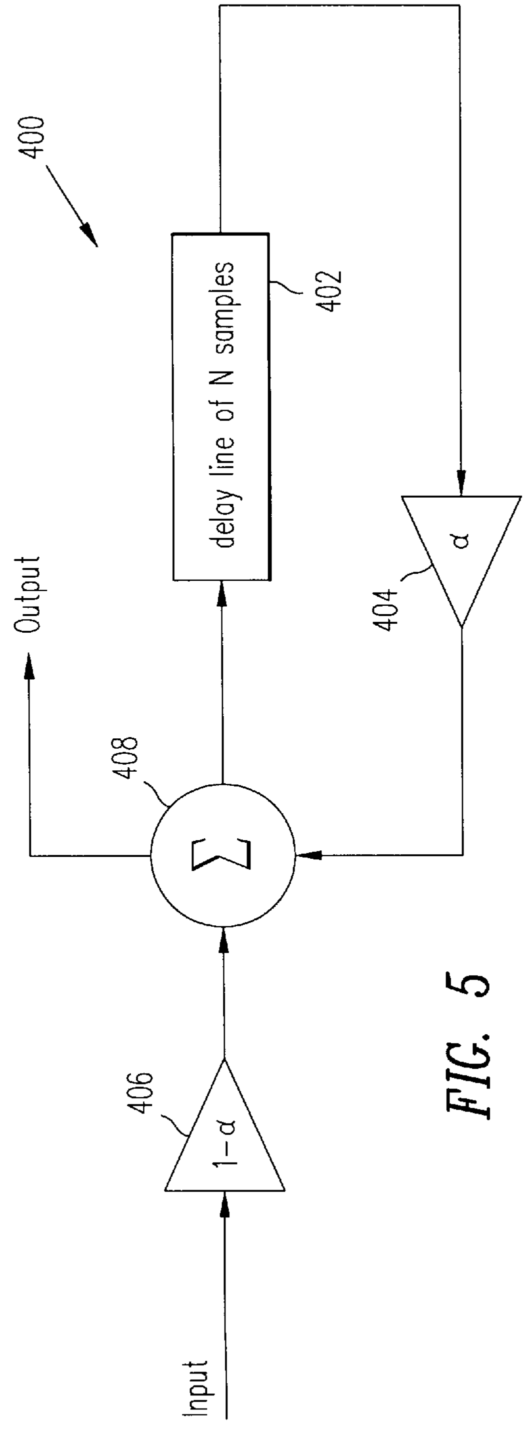
FIG. 5 is a schematic block circuit diagram which illustrates an embodiment of a comb filter for usage as a low pass looping forcing filter.

Referring to FIG. 5, a schematic block circuit diagram illustrates an embodiment of a comb filter 400 for usage as a low pass looping forcing filter. The concept of looping relates to a sampling and analysis of a signal to detect a period at which the signal repeats. The low pass looping forcing filter includes low pass filtering in addition to the sampling and analysis of the signal. Various rules are applied to determine whether a period has been found. One rule is that the period is bounded by two points at which the waveform crosses a DC or zero amplitude level and the derivative at the two points is within a range to be considered equal. A second rule is that the period is either equal to the period of the fundamental frequency of the sample or an integer multiple of the period of the fundamental frequency.

The comb filter 400 has a variable gain and is used as a period forcing filter. The comb filter 400 includes a delay line 402, a feedback amplifier 404, an input amplifier 406, and an adder 408. An input signal is applied to an input terminal of the input amplifier 406. A feedback signal from the delay line 402 is applied to an input terminal of the feedback amplifier 404. An amplified input signal and an amplified feedback signal are applied to the adder 408 from the input amplifier 406 and the feedback amplifier 404, respectively. The delay line 402 receives the sum of the amplified feedback signal and the amplified input signal from the adder 408. The output signal from the comb filter 400 is the output signal from the adder 408. The feedback amplifier 404 has a time-varying selectivity factor $\alpha$. The input amplifier 406 has a time-varying selectively factor $\alpha$-1.

Figure 6:
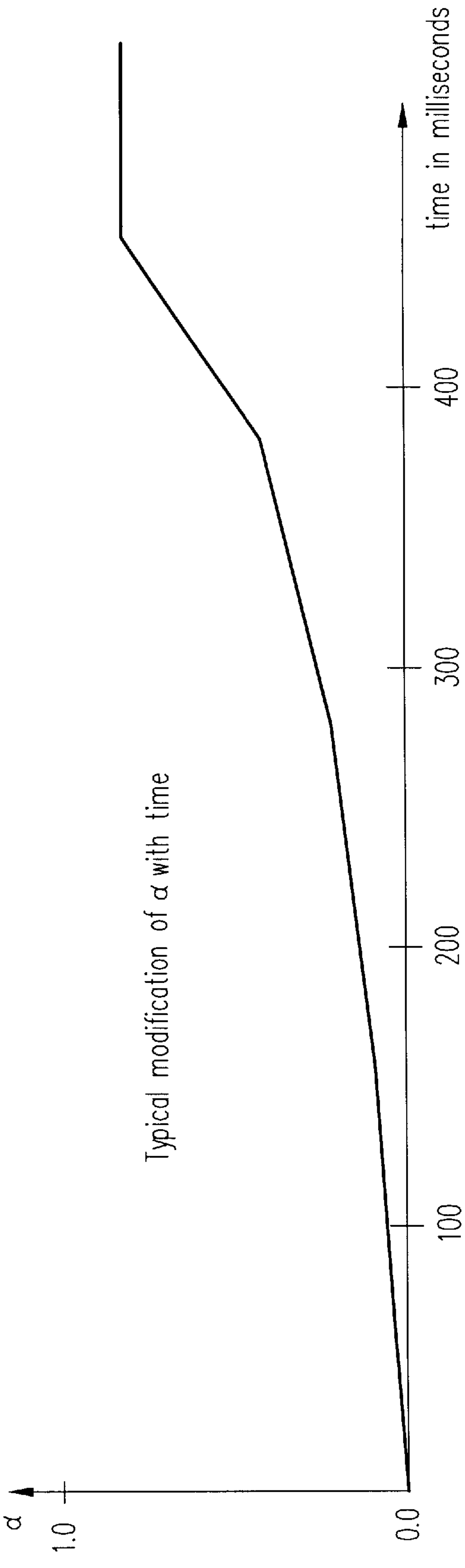
FIG. 6 is a graph showing a typical modification of selectivity factor α with time.

The comb filter 400 has two design parameters, the size N of a delay line 402 in samples at the sampling frequency (44.1 KHz) and a time-varying selectivity factor $\alpha$. Typically, N is either chosen so that the period of the filter is equal to the period of the fundamental frequency of the desired note or chosen so that the period of the filter is an integral number of periods of the fundamental frequency. The variation in selectivity factor $\alpha$ over time is modeled as a series of line segments. Selectivity factor $\alpha$ is depicted in FIG. 6 and usually begins with zero and gradually increases. The level of harmonic content of the signal generally decreases as the selectivity factor α increases. A typical final value of selectivity factor α is 0.9.

Referring again to FIG. 3, the low pass looping 250 step is consistent with a traditional wavetable sample generation process. All conventional and traditional wavetable sample generation methods, which are known in the art, are applicable in the low pass looping 250 step. These methods generally employ steps of sampling a sound signal, looping the sample throughout a suitable sampling period of time to determine a period at which the time domain waveform repeats, and saving samples for the entire period. When the sample is performed, the saved samples of the waveform through a full period of the loop are repetitively read from memory, processed, and performed to recreate the sound.

The optional high pass looping forcing filter step 260 is similar to the low pass looping forcing filter step 240 but is performed on the high frequency components of a sound. The high pass looping forcing filter step 260 is applied to the sample waveforms resulting from the high pass filter 230 step. The high pass looping forcing filter step 260 uses the comb filter 400 shown in FIG. 5 having a selectivity that varies over time to accelerate the removal of nonharmonic spectral components from the nonperiodic waveform. The comb filter 400 is operated using a size N of the delay line 402 in samples at the sampling frequency and a time-varying selectivity factor α that are suitable for the high frequency band samples.

The high pass looping 270 step is similar to the low pass looping 250 step except is performed on the high frequency components of a sound. The high pass looping 270 is applied to the sample waveforms resulting from the high pass looping forcing filter step 260.

The components decimation 280 step is a downsampling operation of sample production. The sub-band voice sample coding steps previous to the components decimation 280 step are performed at the sampling rate of the original sound signal, for example 44.1 KHz, since the creation of repeating periodic structures in a sound signal is facilitated at a high sampling rate. The components decimation 280 step reduces the sampling rate to conserve memory in the sample ROM 106, generating two looped PCM waveforms including a high frequency band waveform and a low frequency band waveform having reduced sampling rates but are otherwise the same as the looped signals generated in the low pass looping 250 step and the high pass looping 270 step.

A goal in the preparation of waveforms for a wavetable synthesizer is the introduction of an inaudible loop into the waveform. A loop is inaudible if no discontinuity in the waveform is inserted where the loop is introduced, the first derivative (the slope) of the waveform is also continuous, the amplitude of the waveform is nearly constant, and the loop size is commensurate with an integral multiple of the fundamental frequency of the sound. A waveform that meets these stipulations is most easily found when the waveform is oversampled at the sampling rate of the original sound signal, for example 44.1 KHz. The components decimation 280 step is used to create a waveform which sounds like the low frequency band and high frequency band looped samples created in the low pass looping 250 step and the high pass looping 270 step, respectively, while substantially reducing the memory size for storing the samples.

The components decimation 280 step includes the substeps of determining a decimation ratio 282, pitch shifting 284 to create an integral loop size when decimated, inserting zeros 286 to generate integral loop end points, decimation 288, and calculating a virtual sampling rate 289. The step of determining a decimation ratio 282 involves selection of the decimation ratio based on the operational characteristics of the interpolation filter shown in FIG. 9. The low frequency edge of the transition band 802 is 0.4 fs, defining the decimation ratio. The decimation ratio is bounded by the initial filtering steps and the filtering frequencies are chosen to be efficient when used with the interpolation filter.

Pitch shifting and interpolation are used to conserve memory since the tone quality (timbre) of a musical instrument does not change radically with small changes in pitch. Accordingly, pitch shifting and interpolation are used to allow recorded waveforms to substitute for tones that are similar in pitch to the original sound when recreated at a slightly different sample rate. Pitch shifting and interpolation are effective for small pitch shifts, although large pitch shifts create audio artifacts such as a high-pitched vibrato sound.

The pitch shifting 284 step shifts the pitch by cubic interpolation to create an integral loop size upon decimation. The pitch shifting 284 is used in the illustrative embodiment since the exemplary Wavetable Synthesizer device 100 only supports loop sizes that are integral. Other embodiments of wavetable synthesizers are not constrained to an integral loop size so that the pitch shifting 284 step is omitted. In one example, a loop having a length of 37 samples at a sampling rate of 44.1 KHz is to be decimated at a decimation ratio of 4, yielding a loop length of 9.25. The nonintegral loop length is not supported by the illustrative Wavetable Synthesizer device 100. Therefore, the pitch shifting 284 step is used to pitch shift the frequency of the waveform by a factor of 1.027777 by cubic interpolation to produce a new waveform sampled at 44.1 KHz with a period of 36 samples.

The inserting zeros 286 step is used if the loop points of the processed waveform are not integrally divisible by the decimation ratio. Zeros are added to the beginning of the sample waveform to move the waveform sufficiently to make the loop points divisible by the decimation ratio.

The decimation 288 step creates a new waveform with a reduced sampling rate by discarding samples from the waveform. The number of samples discarded is determined by the decimation ratio determined in determining the decimation ratio 282 step. For example, a 36-sample waveform resulting from the inserting zeros 286 step is decimated by a decimation ratio of four so that every fourth sample is retained and the other samples are discarded.

The calculation of a virtual sampling rate 289 step is used to adjust the virtual sampling rate so that a recreated signal reproduces the pitch of the original sampled signal. This calculation is made to accommodate the frequency variation arising in the pitch shifting 284 step. For example, if an original note has a frequency of 1191.89 Hz and is adjusted by 1.027777 to produce a loop size of 36, the frequency of the note is shifted to 1225 Hz. When a recreated waveform with a sampling rate of 11025 Hz is played with a loop size of 9 samples, the pitch of the tone is 1225 Hz. To reproduce the original note frequency of 1191.89 Hz, the virtual sampling frequency of the recreated waveform is adjusted down by 1.027777 so that the new waveform has a virtual sampling rate of 10727 Hz and a loop size of 9, creating a tone at 1191.89 Hz.

The miscellaneous reconstruction parameters adjusting 290 step is optionally used to improve samples on a note-by-note basis, as needed, or to conserve memory. The variable sample rate wavetable synthesis technique, as applied both to sustaining sounds and percussive sounds, uses careful selection of various implementation parameters for a particular sound signal to achieve a high sound quality. These implementation parameters include separation frequency, filter frequencies, sampling duration and the like.

For example, a waveform occasionally produces an improved recreated note if a variable filter is applied manually. In another example, memory is conserved if a single sample is shared by more than one frequency band in a sample or even by more than one instrument. A specific illustration of waveform sharing exists in a general MIDI specification in which four pianos are defined including an acoustic grand piano. A waveform for all four pianos is the same with each piano producing a different sound through the variation in one or more reconstruction parameters.

In another example, two parameters control the initial filter cutoff of the time-varying filter. One parameter drops the filter cutoff based on the force of a note. The softer a note is played, the lower the initial cutoff frequency. The second parameter adjusts the initial cutoff frequency based on the amount of pitch shift of a note. As a note is pitch shifted upward, the cutoff is lowered. Pitch shifting downward produces a stronger harmonic content. Adjusting the second parameter facilitates smooth timbral transitions across splits.

Figure 7:
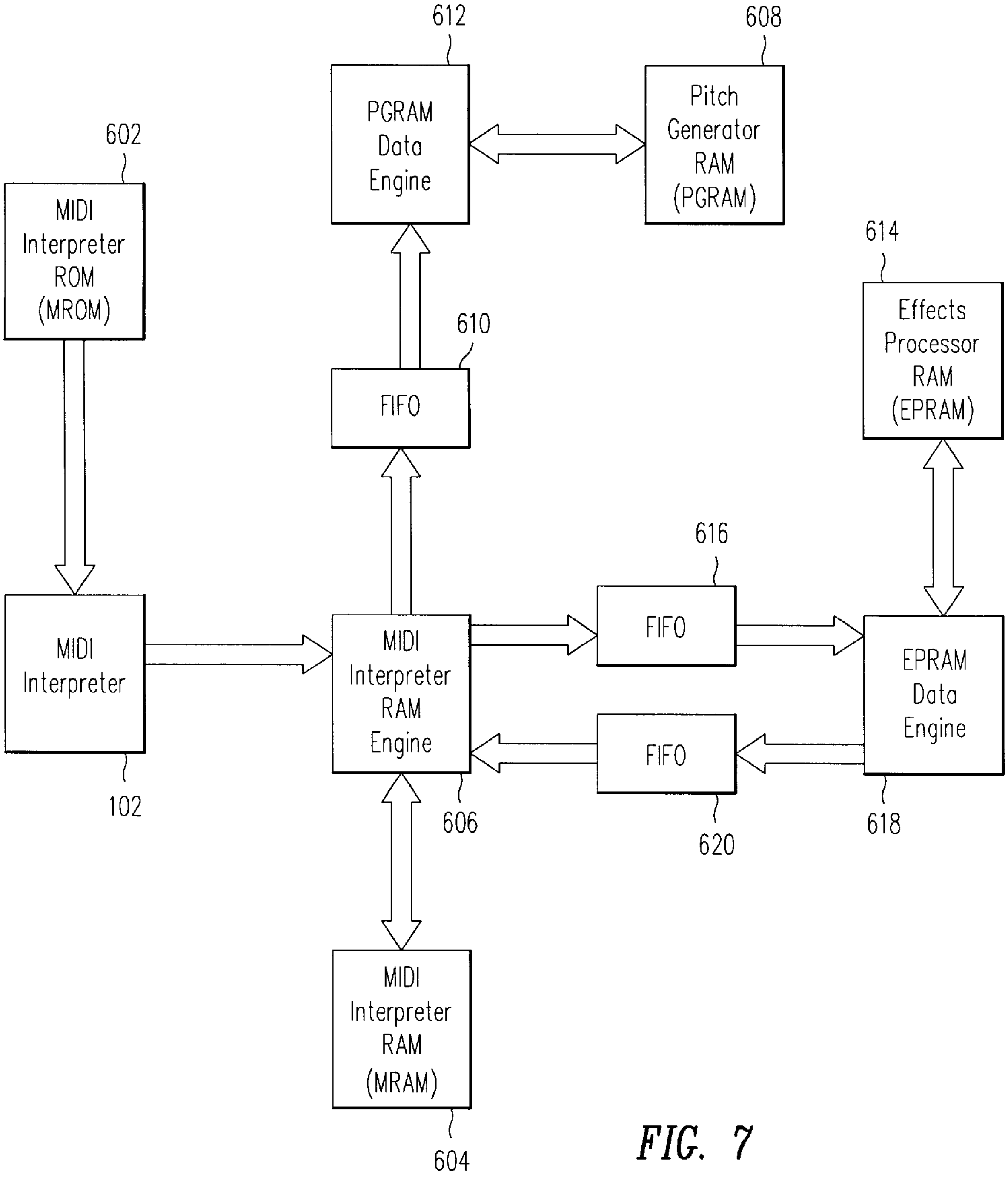
FIG. 7 is a schematic block diagram showing interconnections of a Musical Instrument Digital Interface (MIDI) interpreter with various RAM and ROM structures of a pitch generator and effects processor of the Wavetable Synthesizer device shown in FIG. 1.

Referring to FIG. 7, a schematic block diagram showing interconnections of the Musical Instrument Digital Interface (MIDI) interpreter 102 with various RAM and ROM structures of the pitch generator 104 and effects processor 108. The MIDI interpreter 102 is directly connected to a MIDI interpreter ROM 602 and is connected to a MIDI interpreter RAM 604 through a MIDI interpreter RAM engine 606. The MIDI interpreter RAM engine 606 supplies data to a pitch generator RAM 608 through a first-in-first-out (FIFO) 610 and a pitch generator data engine 612. The MIDI interpreter RAM engine 606 and the pitch generator data engine 612 are typically controllers or state machines for controlling effects processes. The MIDI interpreter RAM engine 606 supplies data to an effects processor RAM 614 through a first-in-first-out (FIFO) 616 and an effects processor data engine 618. The MIDI interpreter RAM engine 606 receives data from the effects processor RAM 614 through a first-in-first-out (FIFO) 620 and the effects processor data engine 618.

The MIDI interpreter ROM 602 supplies information which the MIDI interpreter 102 uses to interpret MIDI commands and format data in response to the issue of a "Note On" command. The MIDI interpreter ROM 602 includes instrument information, note information, operator information and a volume/expression lookup table.

The instrument information is specific to an instrument. One entry in the instrument information section of the MIDI interpreter ROM 602 is allocated and encoded for each instrument supported by the Wavetable Synthesizer device 100. The instrument information for an instrument includes: (1) a total or maximum number of multisamples, (2) a chorus depth default, (3) a reverb depth default, (4) a pan left/right default, and (5) an index into the note information. The multisample number informs the MIDI interpreter 102 of the number of multisamples available for the instrument. The chorus depth default designates a default amount of chorus generated for an instrument for processing in the effects processor 108. The reverb depth default designates a default amount of reverb generated for an instrument for processing in the effects processor 108. The pan left/right default designates a default pan position, generally for percussive instruments. The index into the note information points to the first entry in the note information which corresponds to a multisample for an instrument. The multisample number parameter defines the entries after the first entry that are associated with an instrument.

The note information contains information specific to each multisample note and includes: (1) a maximum pitch, (2) a natural pitch, (3) an operator number, (4) an envelope scaling flag, (5) an operator ROM (OROM)/effects ROM (EROM) index, and (6) a time-varying filter operator parameter (FROM) index. The maximum pitch corresponds to a maximum MIDI key value, a part of the MIDI "Note On" command, for which a particular multisample is used. The natural pitch is a MIDI key value for which a stored sample is recorded. The pitch shift of a note is determined by difference between the requested MIDI key value and the natural pitch value. The operator number defines the number of individual operators or samples that combine to form a note. The envelope scaling factor controls whether an envelope state machine (not shown) scales the envelope time constants with changes in pitch. Normally, the envelope state machine scales the envelope time parameters based on the variance of the MIDI key value from the natural pitch value of a note. The OROM/EROM index points to a first operator ROM entry of a note which, in combination with the subsequent sequence of entries defined by the operator number, encompass the entire note. The OROM/EROM index also points to the envelope parameters for an operator. The FROM index points to a structure in a filter information ROM (not shown) which is associated with the note.

The operator information contains information which is specific to the individual operators or samples used to generate a multisample. Operator information parameters include: (1) a sample address ROM index, (2) a natural sample rate, (3) a quarter pitch shift flag, and (4) a vibrato information ROM pointer. The sample address ROM index points to an address in a sample address ROM (not shown) which contains the addresses associated with a stored sample including start address, end address and loop count. The natural sample rate represents the original sampling rate of the stored sample. The natural sample rate is used for calculating pitch shift variances at the time of receipt of a "Note On" command. The quarter pitch shift flag designates whether pitch shift values are calculated in semitones or quarter semitones. The vibrato information ROM pointer is an index into a vibrato information of the MIDI interpreter ROM 602 which supplies vibrato parameters for the operator.

The volume/expression lookup table contains data for facilitating channel volume and channel expression controls for the MIDI interpreter 102.

The MIDI interpreter RAM 604 stores information regarding the state of internal operators and temporary storage for intercommunication FIFOs. The MIDI interpreter RAM 604 includes a channel information storage, an operator information storage, a pitch generator FIFO storage, and an effects processor FIFO storage.

The channel information storage is allocated to the MIDI interpreter 102 to store information pertaining to a particular MIDI channel. For example, in a 16-channel Wavetable Synthesizer device 100, the channel information storage includes sixteen elements, one for each channel. The channel information storage elements store parameters including a channel instrument assignment assigning an instrument to a particular MIDI channel, a channel pressure value for varying the amount of tremolo added by an envelope generator to a note as directed by a MIDI channel pressure command, a pitch bend value for usage by the pitch generator 104 during phase delta calculations as directed by a MIDI pitch bend change command, and a pitch bend sensitivity defining boundaries of a range of allowed pitch bend values. The channel information storage elements also store parameters including a fine tuning value and a coarse tuning value for tuning a note in phase delta calculations of the pitch generator 104, a pan value for usage by a pan generator of the effects processor 108 as directed by a pan controller change command, and a modulation value for usage by the pitch generator 104 in controlling the amount of vibrato to induce in the channel. The channel information storage elements also store parameters including a channel volume value for setting the volume in a volume generator of the effects processor 108 as directed by a channel volume controller change command, and a channel expression value for controlling the volume of a channel in response to a channel expression controller change command.

The operator information storage is allocated to the MIDI interpreter 102 to store information pertaining to an operator. The operator information storage elements store parameters including an instrument assignment defining the current assignment of an instrument to an operator, an operator-in-use designation indicating whether an operator is available for assignment to a new note on a receipt of a "Note On" command, and an operator off flag indicating whether a "Note Off" command has occurred for a particular note-operator assignment. The instrument assignment is used by the MIDI interpreter 102 to determine which operator to terminate upon receipt of a "Note On" command designating a note which is already played from the same instrument on the same MIDI channel. The operator off flag is used by the MIDI interpreter 102 to determine whether termination of an operator is pending so that a new "Note On" command may be accommodated. The operator information storage elements also store parameters including a MIDI channel parameter designating an assignment of an operator to a MIDI channel, a number of operators associated with a given note, and a sustain flag indicating the receipt of a "Sustain Controller" command for the channel upon which the operator is playing. The sustain flag is used to keep the envelope state machine in a decaying state of the envelope until the sustain is released or the operator decays to no amplitude. The operator information storage elements also store a sostenuto flag indicating the receipt of a "Sostenuto Controller" command for the channel upon which the operator is playing, and a note information storage index, and an operator information storage index. The sostenuto flag indicates that an existing active operator is not to be terminated by a "Note Off" command until a "Sostenuto Off" command is received. The note information storage index points to the note storage for designated Note information. The operator information storage index points to the operator storage for designated operator information.

The FIFO 610 for carrying data information from the MIDI interpreter 102 to the pitch generator 104 is a temporary buffer including one or more elements for storing information and assembling a complete message for usage by the pitch generator 104. The complete message includes a message type field, an operator in use bit indicating whether an operator is allocated or freed, an operator number designating which operator is to be updated with new data, and a MIDI channel number indicating the MIDI channel assignment of an operator. Valid message types include an update operator information type for updating operator information in response to any change in operator data, a modulation wheel change type and a pitch bend change type in response to MIDI commands which affect modulation wheel and pitch bend values, and all sounds off message type. The message also includes pitch shift information, a vibrato selection index, a sample grabber selection index, a designation of the original sample rate for the operator, and a modulation wheel change parameter. The sample rate designation is used to calculate new vibrato rates and phase delta values in a sample grabber 706 (shown in FIG. 8). The modulation wheel change is used to calculate phase delta values for the sample grabber in response to a modulation wheel controller change command.

The FIFO 616 for carrying data information from the MIDI interpreter 102 to the effects processor 108 is a temporary buffer including one or more elements for storing information and assembling a complete message for usage by the effects processor 108. The complete message includes a message type field, an operator in use bit indicating whether an operator is being allocated or deactivated, an envelope scaling bit to determine whether an envelope state machine scales the time parameters for a given operator based on the pitch shift, an operator number designating which operator is to receive the message, a MIDI channel number indicating the MIDI channel assignment of an operator, and an operator off flag for determining if a note off or other command has occurred which terminates the given operator. Valid message types include channel volume, pan change, reverb depth change, chorus depth change, sustain change, sostenuto change, program change, note on, note off, pitch update, reset all controllers, steal operator, all notes off, and all sounds off messages. The message also includes pitch shift information used by an envelope state machine for processing envelope scaling, a "Note On Velocity" when the message type requests allocation of a new operator which is used by the envelope state machine to calculate maximum amplitude values, and a pan value when the message type is a new MIDI pan controller change command. The message further includes channel volume information when a new MIDI channel volume command is received, chorus depth information when a new MIDI chorus depth command is received, and reverb depth information when a new MIDI reverb command is received. Additional information in the message includes indices to the filter information for usage by a filter state machine (not shown), and to the envelope information for usage by the envelope state machine.

The FIFO 620 is a register which is used to determine an "operator stealing" condition. In each frame, the effects processor 108 determines the smallest contributor to the total sound and sends the number of the smallest contributor to the MIDI interpreter 102 via the FIFO 620. If a new "Note On" command is received while all operators are allocated, the MIDI interpreter 102 steals an operator or multiple operators in multiple frames, as needed, to allocate a new note. When the MIDI interpreter 102 steals an operator, a message is sent via the FIFO 616 to inform the effects processor 108 of the condition.

In different embodiments, the effects processor 108 determines the contribution of an operator to a note through an analysis of one or more parameters including the volume of a note, the envelope of an operator, the relative gain of an operator compared to the gain of other operators, the loudness of an instrument relative to all other instruments or sounds, and the expression of an operator. The expression is comparable to the volume of a note but relates more to the dynamic behavior of a note, including tremolo, than to static loudness. In one embodiment, the effects processor 108 evaluates the contribution of a note by monitoring the volume of a note, the envelope of an operator, and the relative gain of an operator compared to the gain of other operators. The effects processor 108 evaluates the contribution of the 64 operators for each period at the sampling frequency and writes the contribution value to the FIFO 620 for transfer to the MIDI interpreter 102. The MIDI interpreter 102 terminates the smallest contributor operator and activates a new operator.

Figure 8:
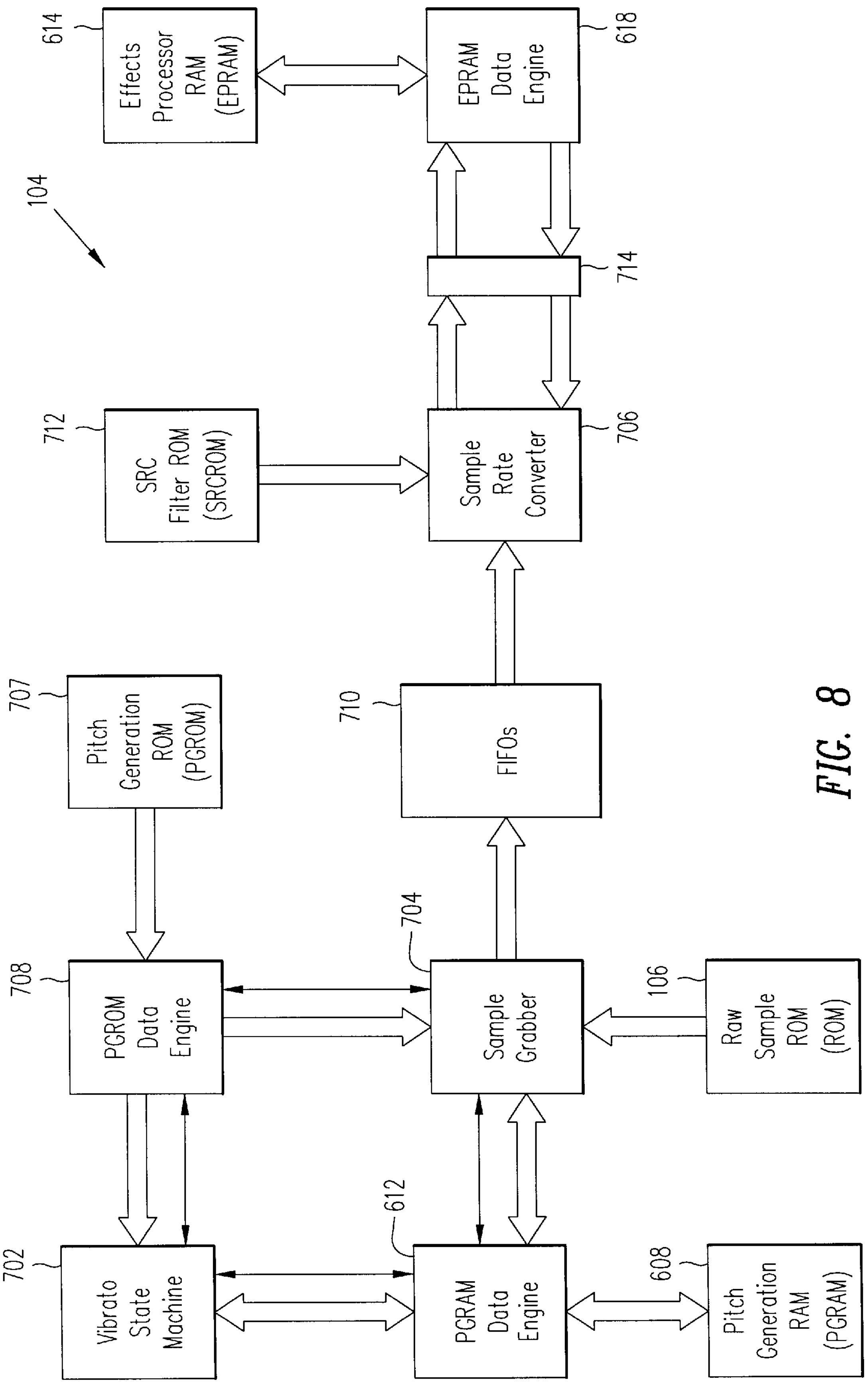
FIG. 8 is a schematic block diagram illustrating a pitch generator of the Wavetable Synthesizer device shown in FIG. 1.

Referring to FIG. 8, a schematic block diagram illustrates a pitch generator 104 which determines the rate at which raw samples are read from the sample ROM 106, processed, and sent to the effects processor 108. In one example, the output data rate is 64 samples, one sample per operator, in each 44.1 KHz frame. The 64 samples for 64 operators are processed essentially in parallel. Each voice note is generally coded into two operators, a high frequency band operator and a low frequency band operator, which are processed simultaneously so that, in effect, two wavetable engines process the two samples independently and simultaneously.

The pitch generator 104 includes three primary computation engines: a vibrato state machine 702, a sample grabber 704, and a sample rate converter 706. The vibrato state machine 702 and the pitch generator data engine 612 are interconnected and mutually communicate control information and data. If vibrato is selected, the vibrato state machine 702 modifies pitch phase by small amounts before raw samples are read from the sample ROM 106. The vibrato state machine 702 also receives data from a pitch generator ROM 707 via a pitch generator ROM data engine 708. The pitch generator data engine 612 and pitch generator ROM data engine 708 are controllers or state machines for controlling access to data storage.

The sample grabber 704 and pitch generator data engine 612 are interconnected to exchange data and control signals. The sample grabber 704 receives raw sample data from the sample ROM 106 and data from the pitch generator ROM 707. The sample grabber 704 communicates data to the sample rate converter 706 via FIFOS 710. The sample grabber 704 reads a current sample ROM address from the pitch generator RAM 608, adds a modified phase delta which is determined by the vibrato state machine 702 in a manner discussed hereinafter, and determines whether a new sample is to be read. This determination is made according to the result of the phase delta addition. If the phase delta addition causes the integer portion of the address to be incremented, the sample grabber 704 reads the next sample and writes the sample to an appropriate FIFO of pitch generator FIFOs 710 which holds the previous eleven samples and the newest sample, for a 12-deep FIFO, for example.

Figure 9:
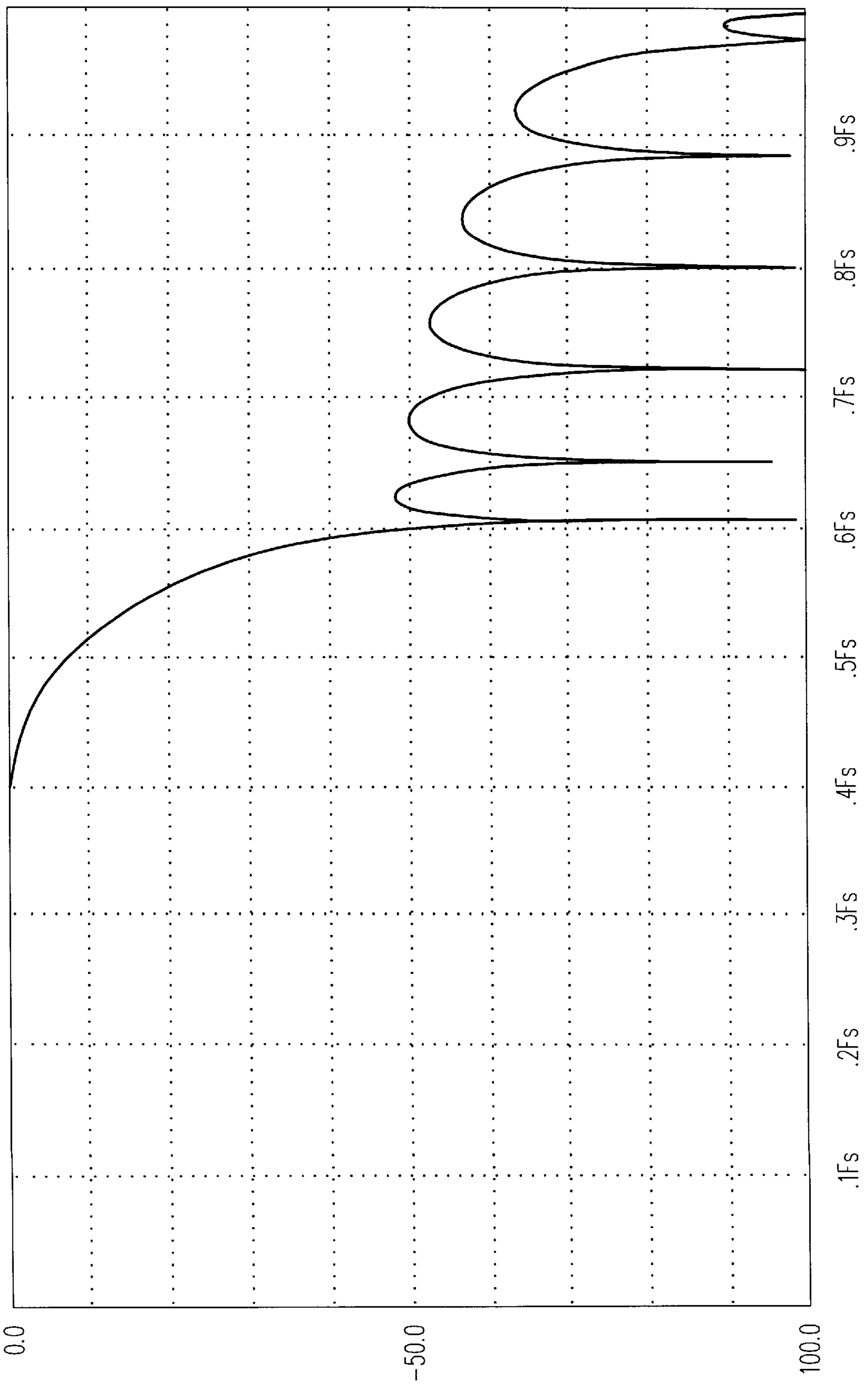
FIG. 9 is a graph which illustrates a frequency response of a suitable 12-tap interpolation filter used in the pitch generator shown in FIG. 8.

The sample rate converter 706 interpolates PCM waveform data acquired from the sample ROM 106. The stored PCM waveforms are sampled at the lowest possible rate, depending on the frequency content of the sample, whether containing low or high frequency components. Ordinary linear interpolation techniques fail to adequately recreate the signals. To substantially improve the reproduction of voice signals, the sample rate converter 706 implements a 12-tap interpolation filter that is oversampled by a ratio of 256. FIG. 9 is a graph which illustrates a frequency response of a suitable 12-tap interpolation filter.

The sample rate converter 706 is connected to the sample grabber 704 via the pitch generator FIFOs 710 and also receives data from a sample rate converter filter ROM 712. The sample rate converter 706 sends data to the effects processor RAM 614 via a sample rate converter output data buffer 714 and the effects processor data engine 618. The sample rate converter 706 reads each FIFO of the pitch generator FIFOs 710 once per frame (for example, 44.1 KHz) and performs a sample rate conversion operation on the twelve samples in the pitch generator FIFOs 710 to interpolate the samples to the designated frame rate (44.1 KHz in this example). The interpolated samples are stored in the effects processor RAM 614 for subsequent processing by the effects processor 108.

The vibrato state machine 702 selectively adds vibrato or pitch variance effects to a note while the note is played. Musicians often make small quasi-periodic variations in pitch or intensity to add richness to a sound. Small changes in pitch are called vibrato. Small changes in intensity are called tremolo. Some instruments, a trumpet for example, naturally include vibrato. The modulation wheel (not shown) also controls the vibrato depth of an instrument. Two types of vibrato are implemented in the illustrative embodiment. A first type vibrato is implemented as an initial pitch shift of an instrument. Vibrato results as the pitch settles over a plurality of cycles. In some implementations, pitch shifting which results in vibrato is recorded into a stored sample. A second type of vibrato is implemented using parameters stored in a vibrato section of the pitch generator ROM 707, which begin generating pitch variances after a selected delay. The amount of pitch shift induced, the beginning time and ending time are stored in the vibrato section of the pitch generator ROM 707. In some embodiments, a waveform which controls the rate at which vibrato is added to a natural sample pitch is stored in a vibrato lookup table within the vibrato information in the MIDI interpreter ROM 602.

Figure 10:
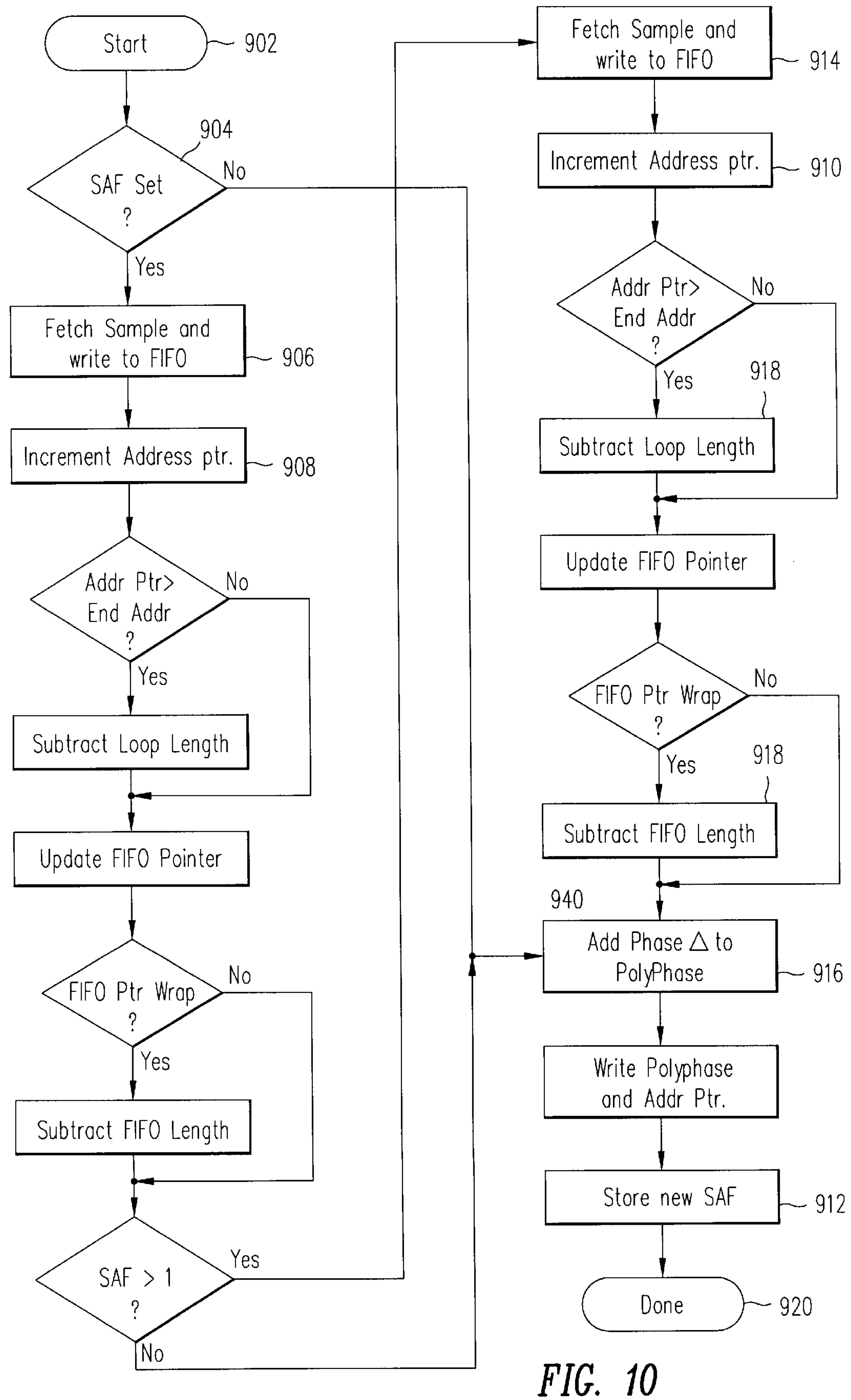
FIG. 10 is a flow chart which illustrates the operation of a sample grabber of the pitch generator shown in FIG. 8.

The sample grabber 704 uses a calculated phase delta value to increment the current address in the sample ROM 106 and determine whether new samples are to be read from the sample ROM 106 and written to the pitch generator FIFOs 710. FIG. 10 is a flow chart which illustrates the operation of the sample grabber 704. When a new frame begins 902, the sample grabber 704 reads a sample address flag (SAF) value 904, from the pitch generator RAM 608. The SAF value informs the sample grabber 704 whether new samples are to be read due to the increment of a previous frame address. If the SAF value is zero, then the sample grabber 704 jumps to a second processing phase 940. If the SAF value is not zero, then the sample grabber 704 reads the next sample 906 from the sample ROM 106 using the current address as a pointer to the sample and writes the sample to the pitch generator FIFOs 710. The sample grabber 704 only moves up to two samples per frame per operator due to ROM/RAM bandwidth limitations. After the samples are moved, the integer portion of the sample address is incremented 908 and written back to the pitch generator RAM 608.

Once the samples are moved, the sample grabber 704 increments 910 the address in sample ROM 106 and sets the SAF flag 912 for the next frame, if necessary. The phase delta for the operator is read from the pitch generator RAM 608 after the vibrato state machine 702 has performed any modifications to the phase delta and added to the current sample address 916. If the phase delta causes an address to be incremented by at least one integer value, then the SAF contains a nonzero value and, during the next frame, a new sample is copied from the sample ROM 106 to the pitch generator FIFOs 710. An incremented integer address is not stored at this time. The sample grabber 704 increments the integer portion of the address during the next frame after moving the sample from the sample ROM 106 to the pitch generator FIFOs 710 and the new value is stored back to the pitch generator RAM 608.

The sample rate converter 706 receives data for each operator in the pitch generator FIFOs 710 and performs a filtering operation on the data to convert the original sample rate to a defined rate, for example 44.1 KHz. For each clock cycle, the sample rate converter 706 reads a sample from the pitch generator FIFOs 710, reads a filter coefficient from the sample rate converter filter ROM 712 and multiplies the sample by the filter coefficient. The multiplication products are accumulated for all samples (for example, twelve samples beginning at the FIFO address) from the pitch generator FIFOs 710. The accumulated products are moved from an accumulator (not shown) within the sample rate converter 706 and moved to an output buffer (not shown) of the sample rate converter 706 and the accumulator is cleared. The sample rate converter 706 repeats this process until all pitch generator FIFOs 710 (for example, 64 FIFOS) are processed.

In one embodiment, the filter coefficient is determined by an operator polyphase value. The sample rate converter filter ROM 712 is organized as 256 sets of 12-tap filter coefficients. The sample grabber 704 polyphase is an 8-bit value which is equivalent to the most significant eight bits of the fractional portion of the operator sample address. The operator sample address is used as an index to select a set of coefficients from the 256 sets of coefficients in the sample rate converter filter ROM 712.

The pitch generator ROM 707 contains three data structures including a sample address ROM, a vibrato default parameters storage, and a vibrato envelope parameters storage. The sample address ROM stores sample addresses for the multisamples stored in the sample ROM 106 including for each sample a starting address location of the first raw sample for a particular multisample, an ending address of the raw sample which is used to determine when the sample grabber 704 is finished, and a loop subtract count for counting backwards from the ending address to the starting address during sample loop processing.

The vibrato default parameters storage holds parameters corresponding to each operator information storage in the MIDI interpreter RAM 604. The vibrato default parameters include a mode flag designating whether the vibrato is implemented as an initial pitch shift or as natural vibrato, and a cents parameter designating the amount of pitch variation added or subtracted from an operator. Two types of vibrato are implemented including a time-varying periodic vibration implementation and pitch ramp or pitch shift implementation. The vibrato default parameters include a start time designating when the vibrato is to begin for both types of vibrato. The vibrato default parameters also include either an end time designating when the vibrato is to end for the time-varying periodic vibrato implementation or the rate at which the pitch is to be raised to the natural pitch for the pitch shift vibrato implementation.

The vibrato envelope parameters storage holds an envelope shape for usage by the vibrato state machine 702 which modifies the phase delta parameter of the sample grabber 704.

The pitch generator RAM 608 is a large block of random access memory including vibrato state machine information and modulation values for usage by the vibrato state machine 702 and the sample grabber 704, respectively. The vibrato state machine information includes a phase delta parameter for incrementing the sample address value for each operator, a previous phase delta for holding the most recent phase delta parameter, and a start phase delta for holding the initial phase delta to add to the operator to implement initial pitch shift vibrato. The vibrato state machine information also includes an original sample rate for calculating the phase delta, a phase depth defining the maximum phase delta for natural vibrato implementations, and a pitch shift semitones and pitch shift cents values indicative of the amount of pitch shift to achieve a requested key value. The vibrato state machine information further includes a vibrato state parameter storing the current state of the vibrato state machine 702 for each of the 64 operators, a vibrato count for storing a count of cycles at the sampling frequency over 64 periods designating the start time for vibrato to begin, and a vibrato delta parameter holding a delta value to be added to the phase delta each frame. The vibrato state machine information includes an operator in use flag, a MIDI channel identifier indicating the MIDI channel for which an operating is generating data, and indices into the vibrato information and the sample grabber information of the MIDI interpreter ROM 602.

The modulation values store channel modulation values which are written by the MIDI interpreter 102 to the pitch generator FIFO of the MIDI interpreter RAM 604.

The sample rate converter 706 includes a random access memory RAM, pitch generator RAM 608, which stores a current sample address for addressing samples in the sample ROM 106 to pitch generator FIFOs 710. The sample rate converter RAM also includes a polyphase parameter holding the fractional portion of the sample address for each operator. In every sampling frequency period and for every operator, the sample rate converter 706 adds the polyphase value to the integer address into the sample ROM 106, adds the phase delta value for each frame and stores the fractional result in the polyphase storage. The RAM also holds a sample advance flag for holding the difference between the sample address calculated by the sample grabber 704 and the original sample address value. In a subsequent frame, the sample rate converter 706 reads the sample advance flag, which determines the number of samples to be moved from the sample ROM 106 to the pitch generator FIFOs 710. The RAM also includes a FIFO address informing the sample rate converter 706 of the location of the newest sample in the pitch generator FIFOs 710.

Figure 11:
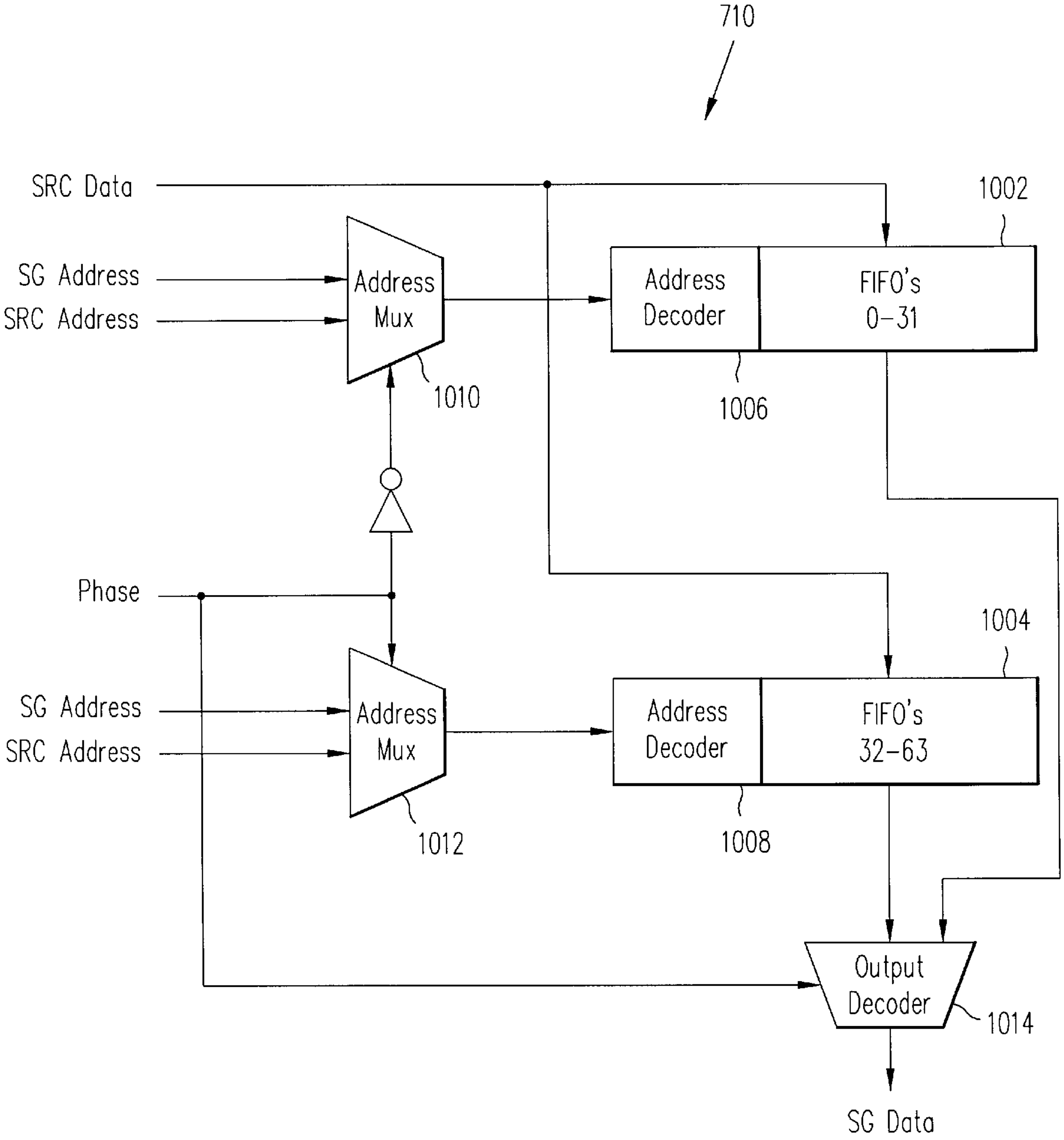
FIG. 11 is a schematic block diagram showing an architecture of the first-in-first-out (FIFO) buffers in the pitch generator shown in FIG. 8.

Referring to FIG. 11, a schematic block diagram shows an architecture of the pitch generator FIFOs 710. In the illustrative embodiment, the pitch generator FIFOs 710 hold the most current and the previous eleven samples for each operator of the 64 operators. The pitch generator FIFOs 710 are organized as 64 buffers 1002 and 1004, each buffer being 12 8-bit words. The sample rate converter 706 reads one FIFO word per clock cycle with 768 reads performed in each frame. The sample grabber 704 writes a maximum of 128 words to the pitch generator FIFOs 710 during each frame. Accordingly, the pitch generator FIFOs 710 have two sets of address decoders 1006 and 1008, one for an upper half of the buffers 1002 and one for the lower half of the buffers 1004. The sample grabber 704 and the sample rate converter 706 always access mutually different buffers of the buffers 1002 and 1004 at any time so that the buffer accesses of the sample grabber 704 and the sample rate converter 706 are made mutually out-of-phase.

During a first phase of operation FIFOs 0–31 of buffers 1002 are written by the sample grabber 704 for processing of 32 operators. Also during the first phase, the sample rate converter 706 reads from FIFOs 32–63 of buffers 1004. During the second phase, the sample grabber 704 updates FIFOs 32–63 of buffers 1004 and the sample rate converter 706 reads from FIFOs 0–31 of buffers 1002. Buffer accessing is controlled by address multiplexers 1010 and 1012 which multiplex the input addresses according to phase, and the output decoder 1014 which determines the output to be passed to the sample rate converter 706 according to phase.

Referring again to FIG. 8, the sample rate converter output data buffer 714 is a storage RAM used to synchronize the pitch generator 104 to the effects processor 108. The sample rate converter 706 writes data to the sample rate converter output data buffer 714 at a rate of 64 samples per frame. The effects processor 108 reads the values as each value is to be processed. The effects processor 108 and the pitch generator 104 by respectively reading and writing values at the same rate. The sample rate converter output data buffer 714 includes two buffers (not shown), one is written by the pitch generator 104 in a frame and copied to the second buffer at the beginning of the next frame. The second buffer is read by the effects processor 108. In this manner, data is held constant with respect to the effects processor 108 and the pitch generator 104 for a complete frame.

Figure 12:
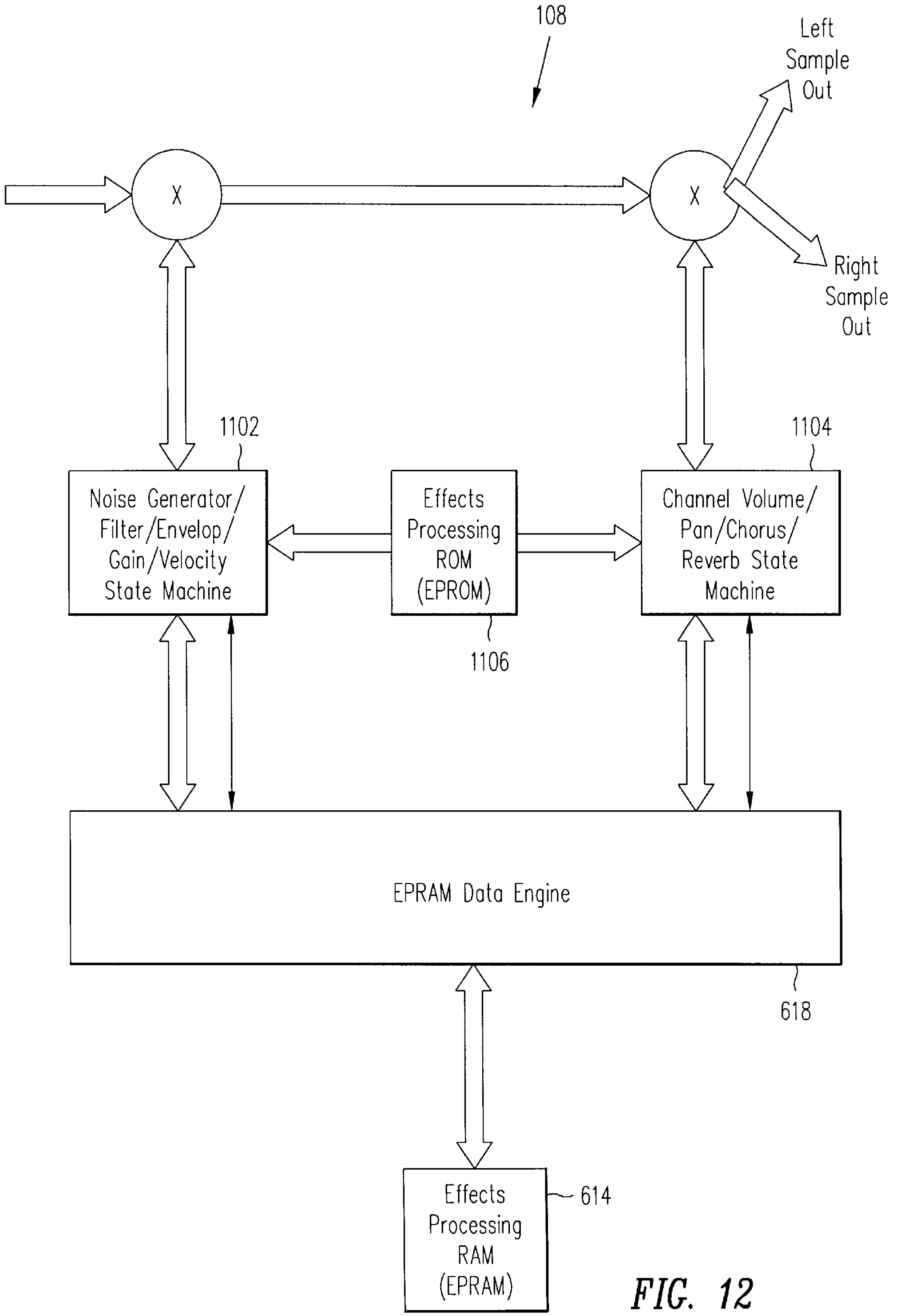
FIG. 12 is a schematic block diagram illustrating an embodiment of the effects processor of the Wavetable Synthesizer device shown in FIG. 1.

Referring to FIG. 12, a schematic block diagram illustrates an embodiment of the effects processor 108. The effects processor 108 accesses samples from the sample rate converter 708 and adds special effects to the notes generated from the samples. The effects processor 108 adds many types of effects to the samples of the operators including effects that enhance an operator sample and effects that implement MIDI commands. The effects processor 108 is depicted as having two major subsections, a first subsection 1102 for processing effects that are common among MIDI channels and a second section 1104 for processing effects that are generated in separate MIDI channels. Both the first subsection 1102 and the second subsection 1104 effects are processed on the basis of operators. The first subsection 1102 and the second subsection 1104 process effects using data held in an effects processor ROM 1106.

The first subsection 1102 processes effects based on operators so that all effects are processed 64 times per frame to handle each operator within a frame. Effects that are common among MIDI channels include random noise generation, envelope generation, relative gain, and time-varying filter processing for operator enhancement. The second subsection 1104 processes effects generated in multiple MIDI channels including channel volume, pan left and pan right, chorus and reverb. The second subsection 1104 also processes effects 64 times per frame, using the sixteen MIDI channel parameters for processing.

Figure 13:
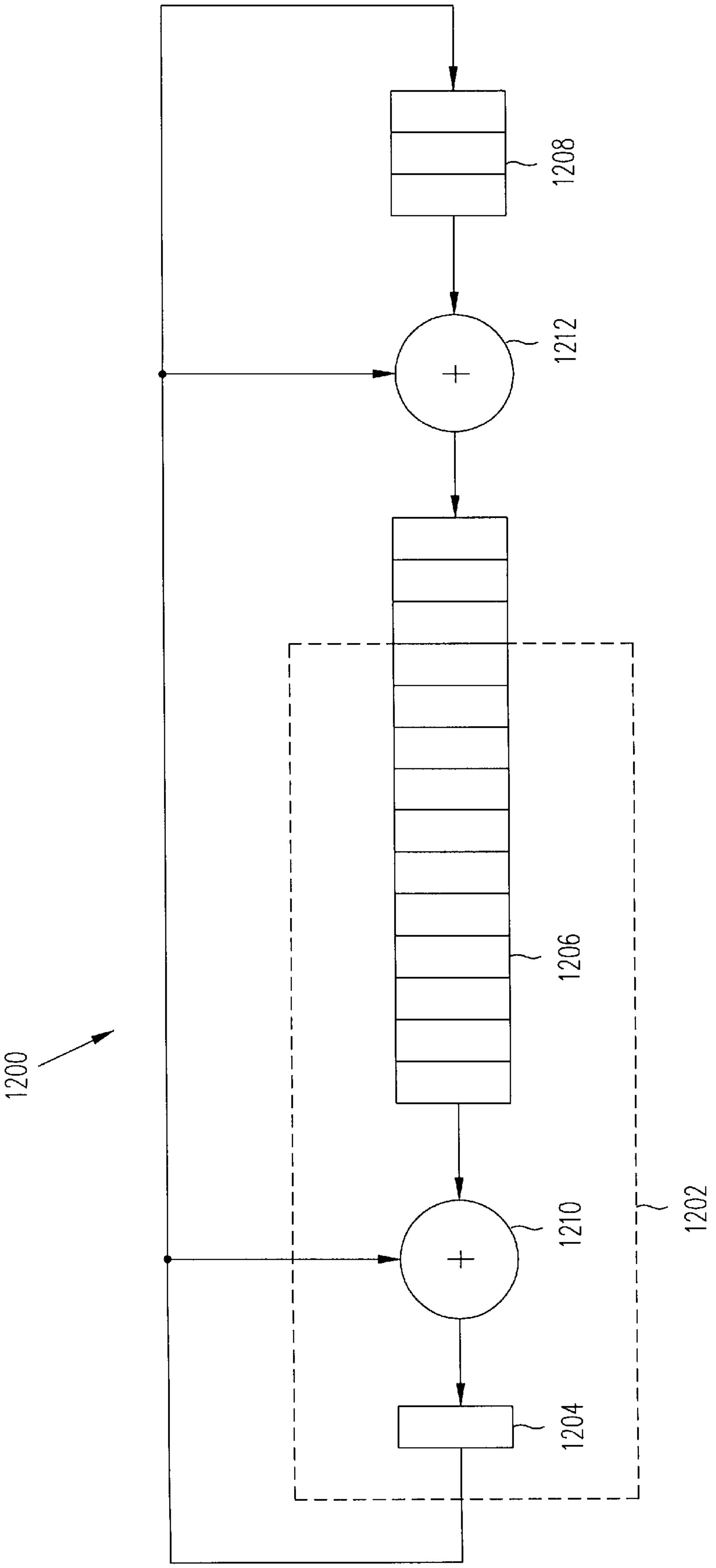
FIG. 13 is a schematic pictorial diagram showing an embodiment of a linear feedback shift register (LFSR) for usage in the effects processor depicted in FIG. 12.

The first subsection 1102 is a state machine which processes effects including white noise generation, time-varying filter processing, and envelope generation. The first subsection 1102 noise generator is implemented in the time-varying filter and, when enabled, generates random white noise during the performance of a note. White noise is used to produce effects such as the sound of a seashore. In one embodiment, the first subsection 1102 noise generator is implemented using a linear feedback shift register (LFSR) 1200 which is depicted in FIG. 13. The a linear feedback shift register (LFSR) 1200 includes a plurality of cascaded flip-flops. Twelve of the cascaded flip-flops form a 12-bit random number register 1202 which is initialized to an initial value. The cascaded flip-flops are shifted left once each cycle. The a linear feedback shift register (LFSR) 1200 includes high-order bit 1204, a 14-bit middle order register 1206, a 3-bit lower order register 1208, a first exclusive-OR (EXOR) gate 1210, and a second exclusive-OR (EXOR) gate 1212. The 12-bit random number register 1202 includes the high-order bit 1204 and the most-significant eleven bits of the middle order register 1206. The first EXOR gate 1210 receives the most significant bit of the 14-bit middle order register 1206 at a first input terminal, receives the high-order bit 1204 at a second input terminal and generates an EXOR result that is transferred to the high-order bit 1204. The second EXOR gate 1212 receives the most significant bit of the 3-bit lower order register 1208 at a first input terminal, receives the high-order bit 1204 at a second input terminal and generates an EXOR result that is transferred to the least-significant bit of the 14-bit middle order register 1202.

Figure 14:
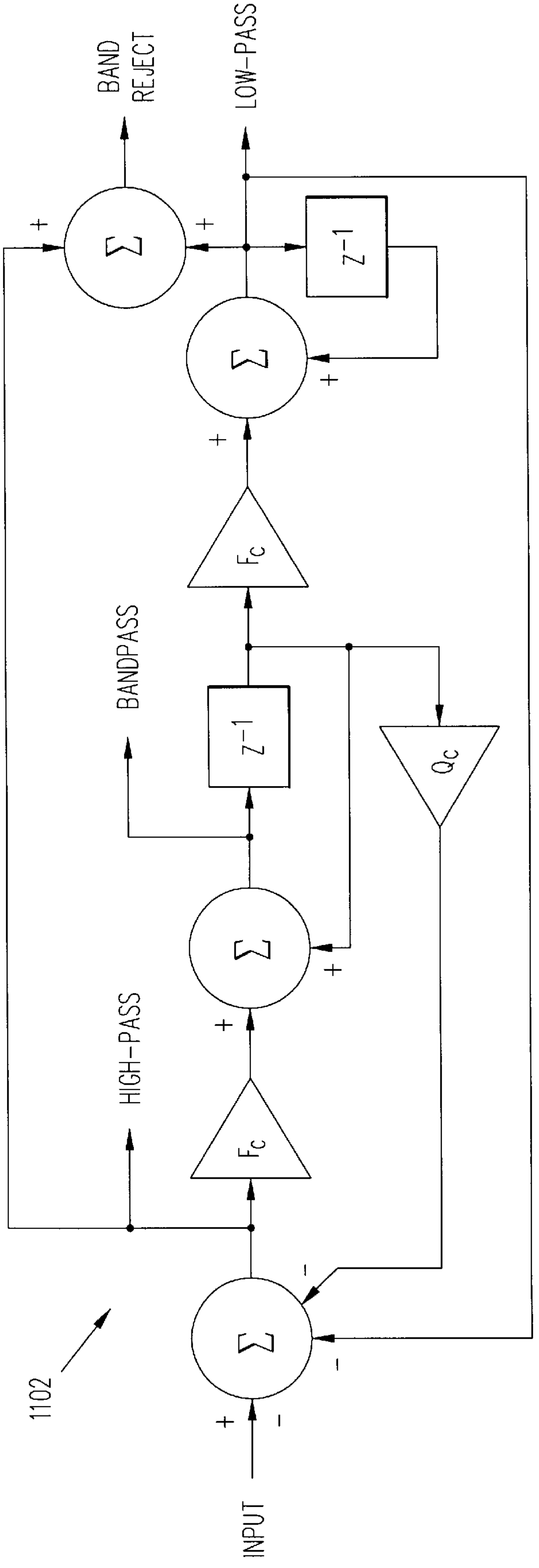
FIG. 14 is a schematic circuit diagram showing a state-space filter for usage in the effects processor depicted in FIG. 12.

Referring to FIG. 14, the first subsection 1102 time-varying filter processing is implemented, in one embodiment, using a state-space filter. The illustrative state-space filter is second-order infinite input response (IIR) filter which is generally used as a low-pass filter. The time-varying filter is implemented to lower the cutoff frequency of a low-pass filter as the duration of a note increases. Generally, the longer a note is held, the more brightness is lost since high-frequency note information has less energy and dissipates rapidly in comparison to low-frequency content.

A time-varying filter is advantageous since natural sounds that decay have a more rapid decay at high frequencies than at low frequencies. A decaying sound that is created using a looping technique and artificial leveling of the waveform is recreated more realistically by filtering the sound signal at gradually lower frequencies over time. The loop is advantageously created earlier in the waveform while tonal variation is retained.

Figure 15:
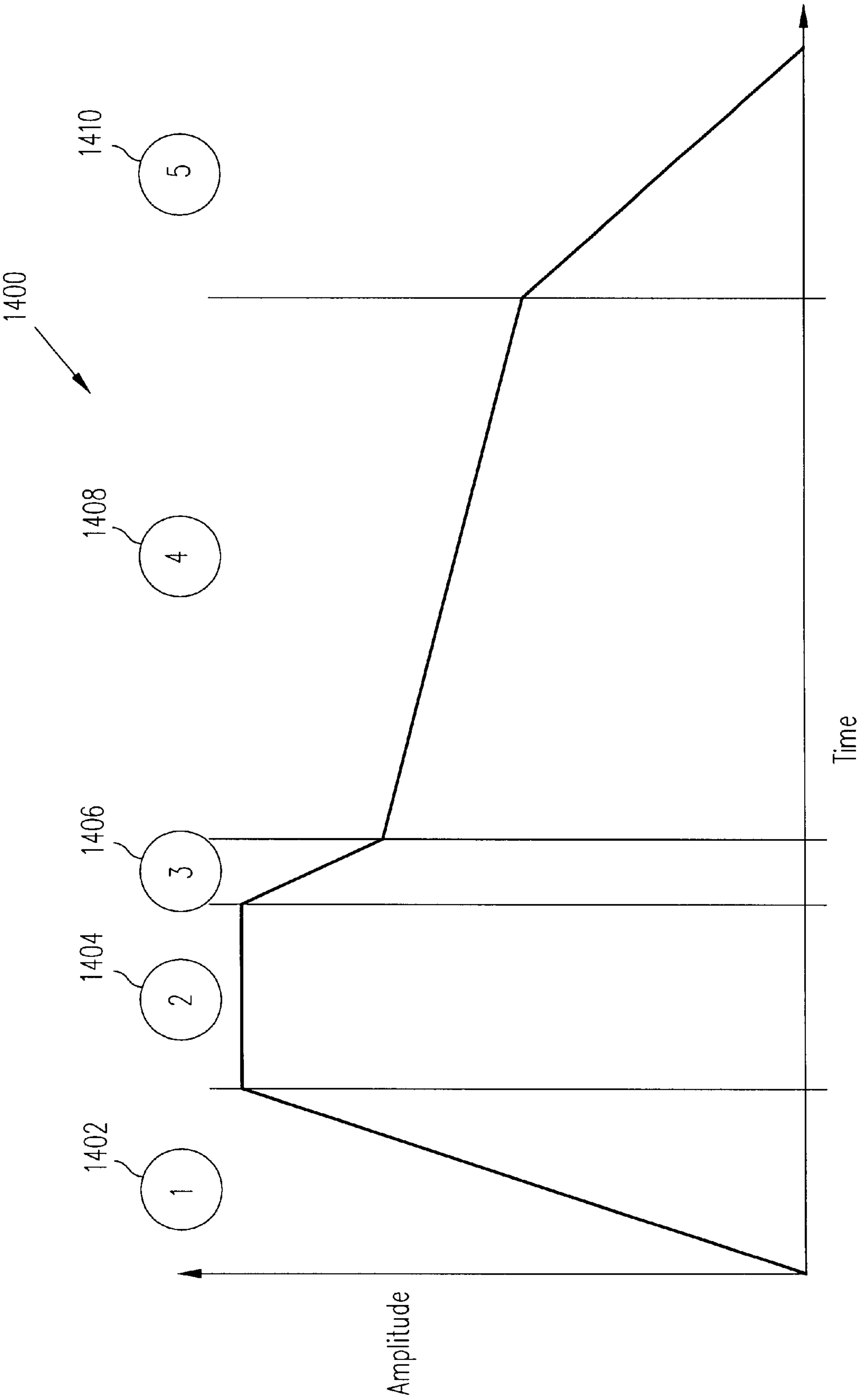
FIG. 15 is a graph which depicts an amplitude envelope function for application to a note signal.

The first subsection 1102 envelope generator generates an envelope for the operators. FIG. 15 is a graph which depicts an amplitude envelope function 1400 on a logarithmic scale for application to a note signal. The amplitude envelope function 1400 has five stages including an attack stage 1402, a hold stage 1404, an initial unnatural decay stage 1406, a natural decay stage 1408, and a release stage 1410. The attack stage 1402 has a short duration during which the amplitude is quickly increased from a zero level to a maximum defined level. The hold stage 1404 following the attack stage 1402 holds the amplitude constant for a selected short duration, which may be a zero duration. The unnatural decay stage 1406 following the hold stage 1404 is imposed to remove unnatural gains that are recorded into the samples. The samples are recorded and stored at a full-scale amplitude. The unnatural decay stage 1406 reduces the amplitude to a natural level for performing the appropriate instrument. The natural decay stage 1408 following the unnatural decay stage 1406 typically has the longest duration of all stages of the amplitude envelope function 1400. During the natural decay stage 1408, the note amplitude slowly tapers in the manner of an actual musical signal. The first subsection 1102 state machine enters the release stage 1410 when a "Note Off" message is received and forces the note to terminate quickly, but in a natural manner. During the release stage 1410, the amplitude is quickly reduced from a current level to a zero level.

The first subsection 1102 envelope generator uses the defined key velocity parameter for a note to determine the form of the envelope. A larger the key velocity is indicative of a harder striking of a key, so that the amplitude of the envelope is increased and the performed note amplitude is larger.

The amplitude of a performed note is largely dependent upon the first subsection 1102 relative gain operation. The relative gain is computed and stored in the effects ROM (EROM) memory with other operator envelope information. The relative gain parameter is a combination of the relative volume of an instrument, the relative volume of a note for an instrument, and the relative volume for an operator in relation to other operators which combine to form a note.

The first subsection 1102 performs the many multiple operator-based rocessing operations within a single state machine using shared relative gain ultipliers. Accordingly, the entire first subsection 1102 state machine time-shares he common multipliers.

Once the operator gains are calculated by the first subsection 1102, the second ubsection 1104 state machine processes channel-specific effects on individual operator output signals. The channel-specific effects include channel volume, left/right pan, chorus and reverb. Accordingly, referring to FIG. 16, the second subsection 1104 state machine includes a channel volume state machine 1502, a pan state machine 1504, a chorus state machine 1506, a chorus engine 1508, a reverb state machine 1510, and a reverb engine 1512.

The channel volume state machine 1502 processes and stores channel volume parameters first since other remaining effects are calculated in parallel using relative volume parameters. In one embodiment, the channel volume is calculated simply using a multiply by a relative value in the linear range of the MIDI channel volume command in accordance with the equation, as follows:

Attenuation from full scale (dB)=40 ln ((VOLUME_value*EXPRESSION_value)/127^2), where the default EXPRESSION_value is equal to 127.

The first effect performed by the channel volume state machine 1502 following the volume determination is a pan effect using a pan state machine 1504. MIDI pan commands specify the amount to pan to the left, and the remainder specifies the amount to pan to the right. For example, in a pan range from 0 to 127, a value of 64 indicates a centered pan. A value of 127 indicates a hard right pan and a value of 0 indicates a hard left pan. In an illustrative embodiment, left and right multiplies are performed by accessing a lookup table value holding the square root of an amount rather than accessing the original amount to keep power constant. Equations for "equal-power" pan scaling is indicated by the following equations:

Left_Scaling=((127-PAN_value)/127)^0.5, and

Right_Scaling=(PAN_value/127)^0.5.

The actual multiplicand is read from the effects processor ROM pan constants based on the pan value. The left and right pan values are calculated and sent to output accumulators. In melodic instrument channels the PAN_value is absolute such that the received value replaces the default value for the instrument selected on the specified channel. In percussive channels the PAN_value is relative to the default value for each of the individual percussive sounds.

The effects processor 108 accesses several sets of default parameters stored in the effects processor ROM 1106 to process the effects. The effects processor ROM 1106 is a shared read-only memory for the channel volume state machine 1502, the pan state machine 1504, the chorus state machine 1506 and the reverb state machine 1510. Default parameters held in the effects processor ROM 1106 include time-varying filter operator parameters (FROM), envelope generator operator parameters (EROM), envelope scaling parameters, chorus and reverb constants, pan multiplicand constants, tremolo envelope shape constants, and key velocity constants.

The time-varying filter operator parameters (FROM) contain information used for adding more natural realism to the notes of an instrument, typically by adding or removing high frequency information. The time-varying filter operator parameters (FROM) include an initial frequency, a frequency shift value, a filter decay, an active start time, a decay time count, an initial velocity filter shift count, a pitch shift filter shift count and a Q value. The initial frequency sets the initial cutoff frequency of the filter. The frequency shift value and filter decay control the rate of frequency cutoff decrease. The active start time determines the duration the filter state machine (not shown) waits to begin filtering data after a note becomes active. The decay time count controls the duration the filter continues to decay before stopping at a constant frequency. The initial velocity filter shift count (IVFSC) controls the amount the filter cutoff frequency is adjusted based on the initial velocity of the note. In one embodiment, the initial velocity filter shift count (IVFSC) adjusts the initial cutoff frequency according to the following equation:

$$freq'=freq-((127-Velocity)*2^{IVFSC}).$$

The pitch shift filter shift count (PSFSC) controls the amount the filter cutoff frequency is adjusted based on the initial pitch shift of the note. In one embodiment, the pitch shift filter shift count (PSFSC) adjusts the initial cutoff frequency according to the following equation:

$$freq'=freq-(PitchShift*2^{IVFSC}).$$

The Q shift parameter determines the sharpness of the filter cutoff and is used in filter calculations to shift the high-pass factor before calculating final output signals.

The envelope generator operator parameters (EROM) define the length of time each operator remains in each state of the envelop and the amplitude deltas for the stages. The envelope generator operator parameters (EROM) include an attack type, an attack delta, a time hold, a tremolo depth, an unnatural decay delta, an unnatural decay time count, a natural decay delta, a release delta, an operator gain, and a noise gain. The attack type determines the type of attack. In one embodiment the attack types are selected from among a sigmoidal/dual hyperbolic attack, a basic linear slope attack, and an inverse exponential attack. The attack delta determines the rate at which the attack increases in amplitude. The time hold determines the duration of the hold stage 1404. The tremolo depth determines the amount of amplitude modulation to add to an envelope to create a tremolo effect. The unnatural decay delta determines the amount the envelope amplitude is reduced during the unnatural decay stage 1406. The unnatural decay time count determines the duration of the unnatural decay stage 1406. The natural decay delta sets the amount the envelope amplitude is reduced during the natural decay stage 1408. The release delta sets the rate of envelope decay during the release stage 1410. The operator gain sets the relative gain value for an operator compared to other operators. The operator gain is used to determine maximum envelope amplitude values. The noise gain determines the amount of white noise to add to an operator.

The envelope scaling parameters include two parameters, a time factor and a rate factor. The time factor and rate factor are used to modify the stored EROM parameters based on the amount a sample is pitch-shifted from the time of original sampling. If the pitch is shifted down, then the time factor is scaled to increase the time constant while rate scaling decreases the decay rates. Conversely if the pitch is shifted higher, the time factor is scaled to decrease the time constant while rate scaling increases decay rates.

The tremolo envelope shape constants are used by the envelope state machine (not shown) to generate tremolo during the sustain stage of a note. The tremolo envelope shape constants include a plurality of constants that form the shape of the tremolo waveform.

The key velocity constants are used by the envelope generator as part of a maximum amplitude equation. The key velocity value indexes into the envelope generator lookup ROM to retrieve a constant multiplicand.

The effects processor RAM 614 is a scratchpad RAM which is used by the effects processor 108 and includes time-varying filter parameters, envelope generator parameters, operator control parameters, channel control parameters, a reverb buffer, and a chorus RAM. The time-varying filter parameters include a filter state, a cutoff frequency, a cutoff frequency shift value, a filter time count, a filter delta, a pitch shift semitones parameter, a delay D1, a delay D2, and a time-varying filter ROM index. The filter state holds the current state of the filter state machine for each operator. The cutoff frequency is the initial cutoff frequency of a filter. The cutoff frequency shift value is the exponent for use in an approximation of exponential decay. The filter time count controls the duration a filter is applied to alter data. The filter delta is the change in cutoff frequency over time as applied in the exponential decay approximation. The pitch shift semitones parameter is the amount of pitch shift an original sample is shifted to supply a requested note. The delay D1 and delay D2 designate the first and second delay elements of the infinite impulse response (IIR) filter. The time-varying filter ROM index is an index into the time-varying filter ROM for an operator.

The envelope generator parameters are used by the envelope generator state machine to compute amplitude multipliers for data and for counting time for each stage of the envelope. The envelope generator parameters RAM include an envelope state, an envelope shift value, an envelope delta, an envelope time count, an envelope multiplier, a maximum envelope amplitude, an attack type and an envelope scaling parameter. The envelope state designates the current state of the envelope state machine for each operator. The envelope shift value contains the current shift value for the envelope amplitude calculation. The envelope delta contains the current envelope decay amplitude delta and is updated when the envelope state machine changes states. The envelope data is read each frame time to update the current envelope amplitude value. The envelope time count holds a count-down value which counts down to 0 and, at the zero count, forces the envelope state machine to change states. The envelope time count is written when the state machine changes states and is read and written each frame. The envelope time count is written for each frame, having the period of the sampling frequency divided by 64. The envelope frame count is written each frame, but not modified every frame. The envelope multiplier contains the amplitude value for multiplying incoming data to generate the envelope. The maximum envelope amplitude is calculated when a new operator is allocated and is derived from the key velocity, the attack type and the attack delta. The attack type is copied from the envelope ROM to effects processor RAM 614 when a new operator is allocated. The envelope scaling flag informs the envelope state machine whether the time and rate constants are scaled during copying from the envelope ROM to the effects processor RAM 614.

The operator control parameters are used by the effects processor 108 to hold data relating to each operator for processing the operator. The operator control parameters include an operator in use flag, an operator off flag, an operator off sostenuto flag, a MIDI channel number, a key on velocity, an operator gain, a noise gain, an operator amplitude, a reverb depth, a pan value, a chorus gain and an envelope generator operator parameters (EROM) index. The operator in use flag defines whether an operator is generating sounds. The operator off flag is set when a Note Off message has been received for the particular note an operator is generating. The operator off sostenuto flag is set when an operator is active and a Sostenuto On command is received for the particular MIDI channel. The Operator Off Sostenuto Flag forces the operator into a sustain state until a Sostenuto Off command is received. The MIDI channel number contains the MIDI channel of the operator. The key on velocity is the velocity value which is part of a Note On command and is used by the envelope state machine to control various parameters. The operator gain is the relative gain of an operator and is written by the MIDI interpreter 102 to the effects processor FIFO when a Note On message is received and the operator is allocated. The noise gain is associated with an operator and is written by the MIDI interpreter 102 to the effects processor FIFO when a Note On message is received and the operator is allocated. The operator amplitude is the attenuation applied to the operator as the operator moves through the data path. The reverb depth is written by the MIDI interpreter 102 to the pitch generator FIFO when a reverb controller change occurs. The pan value is used to index pan constants and is written when a message is received from the MIDI interpreter 102 to the pitch generator FIFO. The pan state machine 1504 uses the pan value to determine the percentage on the output signal to pass to the left and right channel outputs. The chorus gain is used to index chorus constants from ROM. The chorus gain is written when a message causing a chorus gain change occurs and is read each frame by the chorus state machine 1506. The envelope generator operator parameters (EROM) index is used by the envelope state machine to index into the envelope generator operator parameters ROM.

The channel control parameters supply information specific to the MIDI channels for usage by the effects processor 108. The channel control parameters include a channel volume, a hold flag, and a sostenuto pedal flag. The channel volume is written by the MIDI interpreter 102 to the pitch generator FIFO when a channel volume controller change occurs. The hold flag is set when a sustain pedal control on command is received by the MIDI interpreter 102. The envelope state machine reads the hold flag to determine whether to allow an operator to enter the release state when a Note Off message occurs. The sostenuto pedal flag is set when a sostenuto pedal controller on command is received by the MIDI interpreter 102. The envelope state machine reads the sostenuto pedal flag to determine whether to allow an operator to enter the release state when a Note Off command occurs. If the operator off sostenuto flag is set, then the envelope state machine holds the operator in the natural decay state until the flag is reset.

Figure 17:
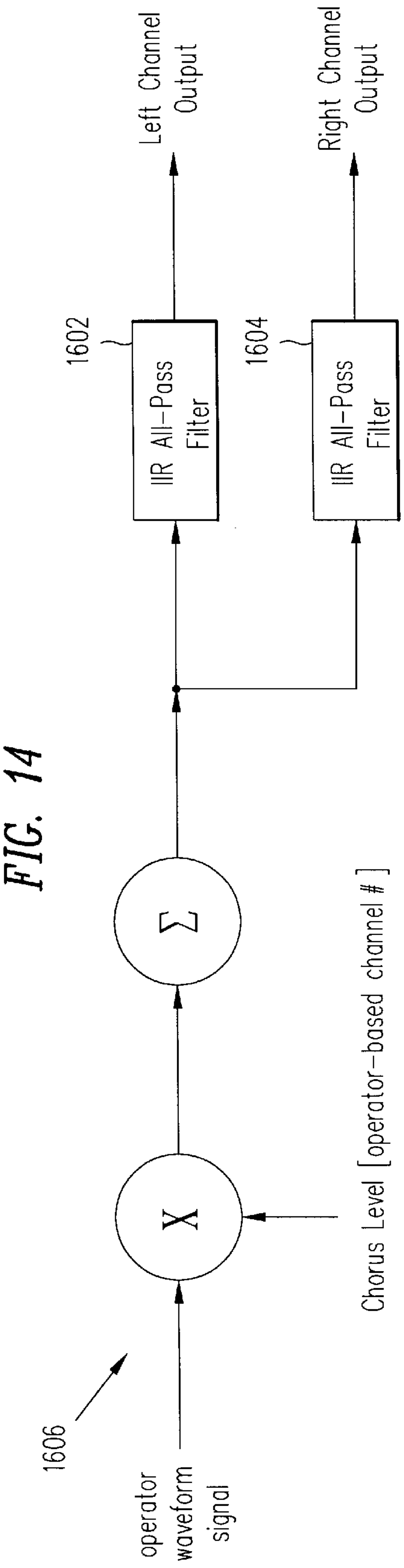
FIG. 17 is a schematic block diagram illustrating components of a chorus processing circuit.

Referring to FIG. 17 in combination with FIG. 16, a schematic block diagram illustrates components of the chorus state machine 1506. Pan is determined and chorus is processed. First, the amount of an operator sample to be chorused is determined for each channel based on a chorus depth parameter. The chorus depth parameter is send via a MIDI command and multipliers are used to determine the percentage of the signal to pass to the chorus algorithm. Once the chorus percentage is determined, the audio signal is processed for chorus. The chorus state machine 1506 includes an IIR all-pass filter 1602 for the left channel and an IIR all-pass filter 1604 for the right channel. The IIR all-pass filters 1602 and 1604 each include two cascaded all-pass IIR filters each operating with a different low frequency oscillator (LFO). The cut-off frequency of the LFOs is swept so that the chorus state machine 1506 operates to spread the phase of the sound signals. The two IIR all-pass filters 1602 and 1604 each include two IIR filters. All four IIR filters have cutoff frequencies that are swept over time so that at substantially all times the four IIR filters have different cutoff frequencies.

While the invention has been described with reference to various embodiments, it will be understood that these embodiments are illustrative and that the scope of the invention is not limited to them. Many variations, modifications, additions and improvements of the embodiments described are possible. For example, one embodiment is described as a system which utilizes a multiprocessor system including a Pentium host computer and a particular multimedia processor. Another embodiment is described as a system which is controlled by a keyboard for applications of game boxes, low-cost musical instruments, MIDI sound modules, and the like. Other configurations which are known in the art of sound generators and synthesizers may be used in other embodiments.

What is claimed is:

1. A method of generating a reverberation effect in a sound signal of a sound signal path comprising:

decimating the sound signal in the sound signal path to form a reduced sample rate sound signal;

inserting a plurality of delays into the sound signal path; filtering delayed sound signals at the plurality of delays;

modulating the filtered sound signals at the plurality of delays to form a plurality of relatively delayed, filtered, and modulated reduced sample rate sound signal; and accumulating the relatively delayed sound signal and the sound signal to form a multiple-echo sound signal having a reduced sample rate.

2. A method according to claim 1, further comprising:

interpolating the multiple-echo sound signal to restore the sample rate to the sample rate prior to decimating the sound signal.

3. A method according to claim 2, further comprising:

filtering the interpolated multiple-echo sound signal; and filtering the sound signal prior to decimating the sound signal.

4. A method according to claim 1, wherein:

modulating the filtered sound signals includes multiplying the filtered and delayed sound signal by a gain factor prior to accumulating the relatively delayed sound signal and the sound signal.

5. A method according to claim 1, further comprising:

inserting a plurality of delays into the sound signal path using a first-in-first-out buffer to form a plurality of delayed sound signals; and accumulating the plurality of delayed sound signals to form a multiple-echo delayed sound signal.

6. A method according to claim 5, further comprising:

filtering the sound signal prior to decimating the sound signal.

7. A method according to claim 5, further comprising:

filtering ones of the plurality of delayed sound signals prior to accumulating the relatively delayed sound signal and the sound signal; and multiplying ones of the filtered and delayed sound signals by a plurality of respective gain factors prior to accumulating the relatively delayed sound signal and the sound signal.

8. A method according to claim 5, further comprising:

adding an undelayed sound signal to the multiple-echo delayed sound signal to generate a first channel multiple-echo sound signal; and subtracting the undelayed sound signal from the multiple-echo delayed sound signal to generate a second channel multiple-echo sound signal.

9. A method according to claim 8, further comprising:

interpolating the first channel multiple-echo sound signal and the second channel multiple-echo sound signal to restore the-sample rate to the sample rate prior to the decimation step; and filtering the first channel interpolated multiple-echo sound signal and the second channel interpolated multiple-echo sound signal.

10. A method according to claim 1 wherein the method is performed in a wavetable synthesizer.

11. A sound synthesizer for performing the method of claim 1.

12. A sound synthesizer comprising:

a sound signal path for carrying a sound signal;

a decimate coupled to the sound signal path for reducing the effective sample rate of the sound signal by a decimation factor;

a delay line of storage elements coupled to the decimator in the sound signal path for generating a sound signal and a relatively delayed sound signal, the delay line having a number of storage elements reduced according to the decimation factor;

a plurality of taps in the delay line for inserting a plurality of delays into the sound signal path to form a plurality of delayed sound signals;

a plurality of tap filters coupled to ones of the plurality taps in the delay line;

a plurality of multipliers coupled to ones of the plurality of tap filters for multiplying ones of the filtered and delayed sound signals by a plurality of respective gain factors input to the adder;

an adder coupled to the plurality of taps for accumulating the plurality of delayed sound signals to form a multiple-echo delayed sound signal; and an accumulator coupled to the delay line in the sound signal path for accumulating the relatively delayed sound signal and the sound signal to form a multiple-echo sound signal having the reduced effective sample rate.

13. A sound synthesizer according to claim 12, further comprising:

an interpolator coupled to the accumulator for interpolating the multiple-echo sound signal to restore the sample rate to the sample rate of the sound signal prior to the decimator.

14. A sound synthesizer according to claim 13, wherein the sound synthesizer is a single integrated circuit chip sound synthesizer.

15. A sound synthesizer according to claim 13, wherein the sound synthesizer is a low-cost and reduced buffer size sound synthesizer.

16. A sound synthesizer according to claim 13, further comprising:

a first filter coupled to the interpolator for filtering the interpolated multiple-echo sound signal;

a second filter coupled to the decimator for filtering the sound signal input to the decimator;

a third filter coupled to the accumulator for filtering the relatively delayed sound signal input to the accumulator; and a multiplier coupled to the third filter for multiplying the filtered and delayed sound signal by a gain factor.

17. A sound synthesizer according to claim 12, further comprising:

an input filter coupled to the decimator for filtering the sound signal input to the decimator.

18. A sound synthesizer according to claim 12, wherein the adder is a first adder further comprising:

a second adder having a first input terminal coupled to the first adder and a second input terminal coupled to the delay line for adding an undelayed sound signal to the multiple-echo delayed sound signal to generate a first channel multiple-echo sound signal; and a subtractor having a first input terminal coupled to the first adder and a second input terminal coupled to the delay line for subtracting the undelayed sound signal from the multiple-echo delayed sound signal to generate a second channel multiple-echo sound signal.

19. A sound synthesizer according to claim 18, further comprising:

an interpolator coupled to the accumulator for interpolating the multiple-echo sound signal to restore the sample rate to the sample rate prior to the decimator; and an output filter coupled to the interpolator for filtering the interpolated multiple-echo sound signal.

20. A sound synthesizer according to claim 12 wherein the sound synthesizer is a wavetable synthesizer.

21. A sound synthesizer according to claim 12, wherein the delay line of storage elements includes:

a first-in-first-out (FIFO) buffer having a plurality of storage words and taps positioned at programmable word positions.

22. A method of generating a reverberation effect in a sound signal of a sound signal path comprising:

decimating the sound signal in the sound signal path to a number of samples reduced by a decimation factor;

buffering the decimated sound signal in a delay line buffer having a number of buffer elements restrained by the decimation factor;

accessing the decimated sound signal at a first tap to access a sound signal and accessing the decimated sound signal at a second tap to access a delayed sound signal;

accessing the decimated sound signal at a plurality of taps to access a plurality of sound signals having a corresponding plurality of delays;

filtering ones of the plurality of sound signals having a corresponding plurality of delays prior to accumulating the relatively delayed sound signal and the sound signal;

multiplying ones of the filtered plurality of sound signals having a corresponding plurality of delays by a plurality of respective gain factors prior to accumulating the relatively delayed sound signal and the sound signal; and accumulating the plurality of sound signals having a corresponding plurality of delays to form a multiple-echo delayed sound signal; and accumulating the delayed sound signal and the sound signal to form a multiple-echo reduced-rate sound signal.

23. A method according to claim 22, further comprising:

interpolating the multiple-echo reduced-rate sound signal to form a restored-rate multiple-echo sound signal.

24. A method according to claim 23, further comprising:

filtering the interpolated multiple-echo sound signal subsequent to the interpolating step; and filtering the sound signal prior to decimating the sound signal.

25. A method according to claim 22, further comprising:

filtering the sound signal prior to decimating the sound signal.

26. A method according to claim 22, further comprising:

adding an undelayed sound signal to the multiple-echo delayed sound signal to generate a first channel multiple-echo sound signal; and subtracting the undelayed sound signal from the multiple-echo delayed sound signal to generate a second channel multiple-echo sound signal.

27. A method according to claim 26, further comprising:

interpolating the first channel multiple-echo sound signal and the second channel multiple-echo sound signal to a restored sample rate; and filtering the first channel interpolated multiple-echo sound signal and the second channel interpolated multiple-echo sound signal.

28. A method according to claim 22 wherein the method is performed in a wavetable synthesizer.

29. A sound synthesizer for performing the method of claim 22.

30. A sound synthesizer comprising:

a sound signal path for carrying a sound signal;

a decimator coupled to the sound signal path for reducing the effective sample rate of the sound signal by a decimation factor;

a delay line of storage elements coupled to the decimator in the sound signal path for generating a sound signal and a relatively delayed sound signal, the delay line having a number of storage elements restrained by the decimation factor;

a plurality of taps coupled to the delay line of storage elements for accessing sound signal data at selected storage elements of the delay line;

a tap filter coupled to the plurality of taps for filtering the sound signal data at selected storage elements of the delay line;

a multiplier coupled to the plurality of taps for multiplying the filtered sound signal data at selected storage elements of the delay line; and an accumulator coupled to the plurality of taps for accumulating the relatively delayed sound signal and the sound signal to form a multiple-echo sound signal having the reduced effective sample rate.

31. A sound synthesizer according to claim 30, further comprising:

an interpolator coupled to the accumulator for interpolating the multiple-echo sound signal having the reduced effective sample rate to form a restored-rate multiple-echo sound signal.

32. A sound synthesizer according to claim 31, further comprising:

an output filter coupled to the interpolator for filtering the interpolated multiple-echo sound signal; and an input filter coupled to the decimator for filtering the sound signal.

33. A sound synthesizer according to claim 32, further comprising:

an adder coupled to the accumulator and coupled to the delay line for adding an undelayed sound signal to the multiple-echo sound signal to generate a first channel multiple-echo sound signal; and a subtractor coupled to the accumulator and coupled to the delay line for subtracting an undelayed sound signal from the multiple-echo sound signal to generate a second channel multiple-echo sound signal.

34. A sound synthesizer according to claim 30, wherein the delay line of storage elements includes:

a first-in-first-out (FIFO) buffer having a plurality of storage words and taps positioned at programmable word positions.

35. A sound synthesizer comprising:

a sound signal path for carrying a sound signal;

a decimator coupled to the sound signal path for reducing the effective sample rate of the sound signal by a decimation factor;

a delay line of storage elements coupled to the decimator in the sound signal path for generating a sound signal and a relatively delayed sound signal, the delay line having a number of storage elements reduced according to the decimation factor;

an accumulator coupled to the delay line in the sound signal path for accumulating the relatively delayed sound signal and the sound signal to form a multiple-echo sound signal having the reduced effective sample rate;

an adder having a first input terminal coupled to the accumulator and a second input terminal coupled to the delay line for adding an undelayed sound signal to the multiple-echo sound signal to generate a first channel multiple-echo sound signal; and a subtractor having a first input terminal coupled to the accumulator and a second input terminal coupled to the delay line for subtracting the undelayed sound signal from the multiple-echo sound signal to generate a second channel multiple-echo sound signal.

36. A method of generating a reverberation effect in a sound signal of a sound signal path comprising:

decimating the sound signal in the sound signal path to form a reduced sample rate sound signal;

inserting a plurality of delays into the sound signal path to form a reduced sample rate sound signal and a plurality of relatively delayed reduced sample rate sound signal; and accumulating the relatively delayed sound signal and the sound signal to form a multiple-echo sound signal having a reduced sample rate;

adding an undelayed sound signal to the multiple-echo delayed sound signal to generate a first channel multiple-echo sound signal; and subtracting the undelayed sound signal from the multiple-echo delayed sound signal to generate a second channel multiple-echo sound signal.

* * * * *